(12) United States Patent
Na et al.

(10) Patent No.: US 10,795,003 B2
(45) Date of Patent: Oct. 6, 2020

(54) HIGH-SPEED LIGHT SENSING APPARATUS

(71) Applicant: Artilux, Inc., Menlo Park, CA (US)

(72) Inventors: Yun-Chung Na, San Jose, CA (US);
Che-Fu Liang, Zhubei (TW)

(73) Assignee: Artilux, Inc., Menlo Park, CA (US)

( * ) Notice: Subject to any disclaimer, the term of this patent is extended or adjusted under 35 U.S.C. 154(b) by 0 days.

(21) Appl. No.: 16/430,019

(22) Filed: Jun. 3, 2019

(65) Prior Publication Data

US 2019/0302243 A1  Oct. 3, 2019

Related U.S. Application Data

(63) Continuation of application No. 16/146,656, filed on Sep. 28, 2018, now Pat. No. 10,353,056, which is a
(Continued)

(51) Int. Cl.
*H01L 27/146* (2006.01)
*G01S 7/4863* (2020.01)
(Continued)

(52) U.S. Cl.
CPC ............ *G01S 7/4863* (2013.01); *G01S 17/10* (2013.01); *G01S 17/89* (2013.01);
(Continued)

(58) Field of Classification Search
CPC ......... H01L 27/14609; H01L 27/14629; H01L 27/14643; H01L 29/161; H01L 31/1037; G01S 7/4863

See application file for complete search history.

(56) References Cited

U.S. PATENT DOCUMENTS 3,621,466 A  11/1971  Toshio
4,341,918 A   7/1982  Evans, Jr. et al.
(Continued)

FOREIGN PATENT DOCUMENTS

EP  2081004  7/2009
EP  2330637  6/2011
(Continued)

OTHER PUBLICATIONS

PCT International Search Report and Written Opinion in International Appln. PCT/US19/19167, dated May 14, 2019, 15 pages.
(Continued)

*Primary Examiner* — Nathan W Ha
(74) *Attorney, Agent, or Firm* — Fish & Richardson P.C.

(57) ABSTRACT

An apparatus including a semiconductor substrate; an absorption layer coupled to the semiconductor substrate, the absorption layer including a photodiode region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, where the second control signal is different from the first control signal.

12 Claims, 20 Drawing Sheets

Related U.S. Application Data continuation of application No. 15/338,660, filed on Oct. 31, 2016, now Pat. No. 10,254,389.

(60) Provisional application No. 62/294,436, filed on Feb. 12, 2016, provisional application No. 62/271,386, filed on Dec. 28, 2015, provisional application No. 62/251,691, filed on Nov. 6, 2015.

(51) Int. Cl.

| | | |
|---|---|---|
| *G01S 17/10* | (2020.01) | |
| *G01S 17/89* | (2020.01) | |
| *H01L 31/103* | (2006.01) | |
| *H01L 29/161* | (2006.01) | |

(52) U.S. Cl.
CPC .. *H01L 27/14609* (2013.01); *H01L 27/14629* (2013.01); *H01L 27/14643* (2013.01); *H01L 29/161* (2013.01); *H01L 31/1037* (2013.01)

(56) References Cited

U.S. PATENT DOCUMENTS

| | | |
|---|---|---|
| 4,604,527 A | 8/1986 | Chenevas-Paula et al. |
| 4,607,168 A | 8/1986 | Oritsuki et al. |
| 4,767,936 A | 8/1988 | Muakami et al. |
| 4,782,376 A | 11/1988 | Catalano |
| 4,926,231 A | 5/1990 | Hwang et al. |
| 5,453,611 A | 9/1995 | Oozu |
| 5,673,284 A | 9/1997 | Congdon et al. |
| 5,965,875 A | 10/1999 | Merrill |
| 6,384,462 B1 | 5/2002 | Pauchard et al. |
| 6,483,130 B1 | 11/2002 | Yang et al. |
| 6,894,267 B2 | 5/2005 | Kakinuma |
| 6,958,194 B1 | 10/2005 | Hopper |
| 7,090,133 B2 | 8/2006 | Zhu |
| 7,411,265 B2 | 8/2008 | Sekiguchi |
| 7,456,874 B1 | 11/2008 | Ono |
| 7,557,368 B2 | 7/2009 | Hegarty et al. |
| 7,629,661 B2 | 12/2009 | Rafferty et al. |
| 7,750,958 B1 | 7/2010 | Dierickx |
| 7,826,058 B1* | 11/2010 | Ullrich ................ G02B 6/3512 356/445 |
| 7,884,310 B2 | 2/2011 | Buettgen |
| 7,961,301 B2 | 7/2011 | Emhart et al. |
| 7,972,885 B1 | 7/2011 | Dutta et al. |
| 8,129,813 B2 | 3/2012 | Herz |
| 8,183,510 B2 | 5/2012 | Venezia et al. |
| 8,824,779 B1 | 9/2014 | Smyth |
| 8,860,083 B1 | 10/2014 | Trezza |
| 8,975,668 B2 | 3/2015 | Costello et al. |
| 9,236,520 B2 | 1/2016 | Okhonin |
| 9,239,626 B1 | 1/2016 | Wu et al. |
| 9,472,588 B1 | 10/2016 | Liu et al. |
| 9,635,351 B2 | 4/2017 | Dielacher et al. |
| 9,748,429 B1 | 8/2017 | Davids et al. |
| 9,786,715 B2 | 10/2017 | Na et al. |
| 9,893,112 B2 | 2/2018 | Na et al. |
| 10,418,407 B2 | 9/2019 | Na et al. |
| 10,564,718 B2 | 2/2020 | Na et al. |
| 2003/0042500 A1 | 3/2003 | Rhodes et al. |
| 2003/0189159 A1 | 10/2003 | Lnoue |
| 2004/0121507 A1 | 6/2004 | Bude et al. |
| 2005/0051730 A1 | 3/2005 | Kuijk et al. |
| 2005/0077588 A1 | 4/2005 | Kasuga |
| 2005/0167709 A1* | 8/2005 | Augusto ............ H01L 27/14643 257/292 |
| 2005/0186759 A1 | 8/2005 | So |
| 2005/0233495 A1 | 10/2005 | Yang et al. |
| 2006/0110844 A1 | 5/2006 | Lee et al. |
| 2006/0289957 A1 | 12/2006 | Morse et al. |
| 2007/0164767 A1 | 7/2007 | Herz |
| 2007/0187796 A1 | 8/2007 | Rafferty et al. |
| 2007/0218578 A1 | 9/2007 | Lee et al. |
| 2007/0218580 A1 | 9/2007 | Hsu et al. |
| 2008/0121866 A1 | 5/2008 | Yuan et al. |
| 2008/0157254 A1 | 7/2008 | Kang |
| 2008/0181452 A1 | 7/2008 | Kwon et al. |
| 2008/0303058 A1 | 12/2008 | Mori et al. |
| 2009/0242935 A1 | 1/2009 | Fitzgerald |
| 2009/0050891 A1 | 2/2009 | Katoh |
| 2009/0152604 A1 | 6/2009 | Zhu et al. |
| 2009/0166684 A1 | 7/2009 | Yahav et al. |
| 2009/0200589 A1 | 8/2009 | Qian et al. |
| 2009/0237770 A1* | 9/2009 | Kim ...................... G02F 1/025 359/276 |
| 2010/0078680 A1 | 4/2010 | Cheng et al. |
| 2010/0102409 A1 | 4/2010 | Hansson |
| 2010/0184246 A1 | 7/2010 | Sakai |
| 2011/0031578 A1 | 2/2011 | Miura et al. |
| 2011/0102553 A1 | 5/2011 | Corcoran |
| 2011/0109880 A1 | 5/2011 | Nummela |
| 2011/0128430 A1 | 6/2011 | Fossum |
| 2011/0155893 A1 | 6/2011 | Endo et al. |
| 2011/0181591 A1 | 7/2011 | Benitez et al. |
| 2011/0188780 A1 | 8/2011 | Wang et al. |
| 2011/0255071 A1 | 10/2011 | Van Der Tempel |
| 2011/0304696 A1 | 12/2011 | Centen et al. |
| 2012/0080726 A1 | 4/2012 | Sakano |
| 2012/0133922 A1 | 5/2012 | Pfaff |
| 2012/0241769 A1 | 9/2012 | Katoh |
| 2012/0248514 A1 | 10/2012 | Korekado et al. |
| 2012/0287085 A1 | 11/2012 | Yuki et al. |
| 2012/0307232 A1 | 12/2012 | Mase |
| 2013/0026548 A1 | 1/2013 | McCarten |
| 2013/0062506 A1 | 3/2013 | Hu |
| 2013/0062522 A1 | 3/2013 | Jiang et al. |
| 2013/0062663 A1 | 3/2013 | Yuan et al. |
| 2013/0075607 A1 | 3/2013 | Bikumandla et al. |
| 2013/0119234 A1 | 5/2013 | Lee et al. |
| 2013/0128070 A1 | 5/2013 | Ishikawa |
| 2013/0154918 A1 | 6/2013 | Vaught |
| 2013/0214161 A1 | 8/2013 | Cazaux et al. |
| 2013/0248865 A1 | 9/2013 | Toriyama et al. |
| 2013/0278631 A1 | 10/2013 | Border et al. |
| 2013/0280879 A1 | 10/2013 | Stecher et al. |
| 2013/0283213 A1 | 10/2013 | Guendelman |
| 2013/0321271 A1 | 12/2013 | Bychkov |
| 2014/0002700 A1* | 1/2014 | Oishi ..................... H04N 5/369 348/273 |
| 2014/0043227 A1 | 2/2014 | Skogo et al. |
| 2014/0054444 A1 | 2/2014 | Sasaki |
| 2014/0054736 A1 | 2/2014 | Meade et al. |
| 2014/0111664 A1 | 4/2014 | Kumano |
| 2014/0117428 A1 | 5/2014 | Lee et al. |
| 2014/0159129 A1 | 6/2014 | Wang |
| 2014/0183549 A1 | 7/2014 | Park et al. |
| 2014/0184496 A1 | 7/2014 | Gribetz et al. |
| 2014/0206443 A1 | 7/2014 | Sharp et al. |
| 2014/0252437 A1 | 9/2014 | Ho et al. |
| 2014/0285404 A1 | 9/2014 | Takano et al. |
| 2014/0285420 A1 | 9/2014 | Kamimura et al. |
| 2014/0285641 A1 | 9/2014 | Kato et al. |
| 2014/0312206 A1 | 10/2014 | Okhonin et al. |
| 2014/0367740 A1 | 12/2014 | Morse |
| 2014/0368613 A1 | 12/2014 | Krupka |
| 2015/0001664 A1 | 1/2015 | Van Der Tempel |
| 2015/0014661 A1 | 1/2015 | Joo et al. |
| 2015/0022435 A1 | 1/2015 | Luebke |
| 2015/0041761 A1 | 2/2015 | Cheng et al. |
| 2015/0043826 A1 | 2/2015 | Ishimitus |
| 2015/0092983 A1 | 4/2015 | Nguyen |
| 2015/0171146 A1 | 6/2015 | Ooki et al. |
| 2015/0193938 A1 | 7/2015 | Freedman et al. |
| 2015/0281618 A1 | 10/2015 | Saito |
| 2015/0286340 A1 | 10/2015 | Send et al. |
| 2015/0331508 A1 | 11/2015 | Nho et al. |
| 2016/0027837 A1 | 1/2016 | Webster et al. |
| 2016/0049476 A1 | 2/2016 | Rachmady et al. |
| 2016/0141329 A1 | 5/2016 | Cheng et al. |
| 2016/0150174 A1 | 5/2016 | Hynecek |
| 2016/0155883 A1 | 6/2016 | Shi et al. |
| 2016/0161599 A1 | 6/2016 | Seliuchenko et al. |
| 2016/0172393 A1 | 6/2016 | Kim |

(56) References Cited

U.S. PATENT DOCUMENTS

| | | |
|---|---|---|
| 2016/0187976 A1 | 6/2016 | Levesque et al. |
| 2016/0190304 A1 | 6/2016 | Morin et al. |
| 2016/0225922 A1 | 8/2016 | Akkaya et al. |
| 2016/0239974 A1 | 8/2016 | Wang |
| 2016/0284750 A1 | 9/2016 | Ionescu et al. |
| 2016/0316159 A1 | 10/2016 | Yoneda |
| 2016/0335475 A1 | 11/2016 | Krenzer et al. |
| 2016/0372502 A1 | 12/2016 | Li et al. |
| 2016/0381789 A1 | 12/2016 | Rogers et al. |
| 2017/0040361 A1 | 2/2017 | Ikeda et al. |
| 2017/0040362 A1 | 2/2017 | Na et al. |
| 2017/0062508 A1 | 3/2017 | Na et al. |
| 2017/0068319 A1 | 3/2017 | Viswanathan |
| 2017/0075421 A1 | 3/2017 | Na et al. |
| 2017/0084648 A1 | 3/2017 | Liu et al. |
| 2017/0123233 A1 | 5/2017 | Sabovic |
| 2017/0142362 A1 | 5/2017 | Liu |
| 2017/0177075 A1 | 6/2017 | Zhang |
| 2017/0196451 A1 | 7/2017 | Tian |
| 2017/0221212 A1 | 8/2017 | Adam et al. |
| 2017/0223339 A1 | 8/2017 | Kondo et al. |
| 2017/0237911 A1 | 8/2017 | Won |
| 2017/0244949 A1 | 8/2017 | Peterson |
| 2018/0006081 A1 | 1/2018 | Na et al. |
| 2018/0007255 A1 | 1/2018 | Tang |
| 2018/0012916 A1 | 1/2018 | Na et al. |
| 2018/0012917 A1 | 1/2018 | Na et al. |
| 2018/0012918 A1 | 1/2018 | Na et al. |
| 2018/0061883 A1 | 3/2018 | Na et al. |
| 2018/0137610 A1 | 5/2018 | Aflaki |
| 2018/0151732 A1 | 5/2018 | Mehandru |
| 2018/0175084 A1 | 6/2018 | Na et al. |
| 2018/0175095 A1 | 6/2018 | Sallin |
| 2018/0188356 A1 | 7/2018 | Na et al. |
| 2018/0190698 A1 | 7/2018 | Na et al. |
| 2018/0190702 A1 | 7/2018 | Na et al. |
| 2018/0233521 A1 | 8/2018 | Na et al. |
| 2018/0233528 A1 | 8/2018 | Na et al. |
| 2018/0247968 A1 | 8/2018 | Na et al. |
| 2018/0261645 A1 | 9/2018 | Na et al. |
| 2018/0269239 A1 | 9/2018 | Na et al. |
| 2019/0011984 A1 | 1/2019 | Na et al. |
| 2019/0049564 A1 | 2/2019 | Na et al. |
| 2019/0103435 A1 | 4/2019 | Na et al. |
| 2019/0081095 A1 | 5/2019 | Hanzawa et al. |

FOREIGN PATENT DOCUMENTS

| | | |
|---|---|---|
| JP | H0548139 | 2/1993 |
| JP | 2000-133791 | 5/2000 |
| JP | 2003-225207 | 8/2003 |
| JP | 2004-103964 | 4/2004 |
| JP | 2004-309701 | 11/2004 |
| JP | 2005-123674 | 5/2005 |
| JP | 2009-025225 | 2/2009 |
| JP | 2009-047658 | 3/2009 |
| JP | 2011-66097 | 3/2011 |
| JP | 2011-128024 | 6/2011 |
| JP | 2012-146920 | 8/2012 |
| JP | 2015-194838 | 11/2015 |
| WO | WO 2005/036647 | 4/2005 |
| WO | WO 2013/104718 | 7/2013 |
| WO | WO 2014/085789 | 6/2014 |
| WO | WO 2014/197226 | 12/2014 |
| WO | WO 2015/104307 | 7/2015 |
| WO | WO 2016/038416 | 3/2016 |
| WO | WO 2016/077791 | 5/2016 |
| WO | WO 2016/187566 | 11/2016 |
| WO | WO 2016/208215 | 12/2016 |
| WO | WO 2017/015580 | 1/2017 |
| WO | WO 2017/018477 | 2/2017 |
| WO | WO 2017/024121 | 2/2017 |
| WO | WO 2017/035447 | 3/2017 |

OTHER PUBLICATIONS

Extended European Search Report in European Application No. 16833863, dated Jul. 18, 2018, 6 pages.
Extended European Search Report in European Application No. 168630325, dated Aug. 23, 2018, 5 pages.
Extended European Search Report in European Application No. 181602004, dated Jul. 18, 2018, 6 pages.
Extended European Search Report in European Application No. 181602053, dated Jul. 18, 2018, 6 pages.
Extended European Search Report in European Application No. 181760315, dated Aug. 27, 2018, 6 pages.
Extended European Search Report in European Application No. 16828622, dated Sep. 7, 2018, 6 pages.
EP Search Report in European Application No. EP18189000, dated Jan. 9, 2019, 17 pages.
International Preliminary Report on Patentability in International Application No. PCT/US2016/043609, dated Jan. 23, 2018, 12 pages.
International Preliminary Report on Patentability in International Application No. PCT/US2016/045526, dated Feb. 6, 2018, 10 pages.
International Preliminary Report on Patentability in International Application No. PCT/US2016/048915, dated Feb. 27, 2018, 8 pages.
International Preliminary Report on Patentability in International Application No. PCT/US2016/060493, dated May 8, 2018, 11 pages.
International Preliminary Report on Patentability in International Application No. PCT/US2016/066073, dated Jul. 12, 2018, 7 pages.
International Search Report and Written Opinion in International Application No. PCT/US2016/043609, dated Nov. 1, 2016, 21 pages.
International Search Report and Written Opinion in International Application No. PCT/US2016/045526, dated Nov. 22, 2016, 15 pages.
International Search Report and Written Opinion in International Application No. PCT/US2016/048915, dated Nov. 22, 2016, 17 pages.
International Search Report and Written Opinion in International Application No. PCT/US2016/060493, dated Jan. 10, 2017, 20 pages.
International Search Report and Written Opinion in International Application No. PCT/US2016/066073, dated May 6, 2018, 16 pages.
International Search Report and Written Opinion in International Application No. PCT/US2018/020262, dated Jun. 6, 2018, 14 pages.
International Search Report and Written Opinion in International Application No. PCT/US2018/025949, dated Jul. 10, 2018, 14 pages.
International Search Report and Written Opinion in International Application No. PCT/US2018/027369, dated Jul. 31, 2018, 14 pages.
Alsam et al: "What the Eye Did Not See—A Fusion Approach to Image Coding", Advances in Visual Computing, dated Jan. 1, 2012, pp. 199-208 (with partial english translation).
Bamji et al., "A 0.13 μm CMOS System-on-Chip for a 512×424 Time-of-Flight Image Sensor With Multi-Frequency Photo-Demodulation up to 130 MHz and 2 GS/s ADC," IEEE J Solid-State Circuits, Jan. 2015, 50(1):303-319.
Bianco et al., "A Comparative Analysis between Active and Passive Techniques for Underwater 3D Reconstruction of Close-Range Objects," Sensors, Aug. 20, 2013, 13(8):11007-11031.
Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.
Dalla Betta et al., "Design and Characterization of Current-Assisted Photonic Demodulators in 0.18-μm CMOS Technology," IEEE Trans. Electron. Dev., Jun. 2011, 58(6):1702-1709.

(56) References Cited

OTHER PUBLICATIONS

Fang et al., "An Integration PIN/MISS OEIC for High Current Photoreceiver Applications," IEEE Transactions on Electron Devices, Jan. 1997, 44(1):33-38.

Feng et al., "Vertical p-i-n. germanium photodetector with high external responsivity integrated with large core Si waveguides," Optics Express, Jan. 4, 2010, 18(1):96-101.

Foix et al., "Lock-in Time-of-Flight (ToF) Cameras: A Survey," IEEE Sensors J., Sep. 2011, 11(9):1917-1926.

Fossum et al., "A Review of the Pinned Photodiode for CCD and CMOS Image Sensors," IEEE J. Electron Devices Soc. May 1, 2014, 2(3):33-43.

Hutchinson et al., "High-Resolution Aliasing-Free Optical Beam Steering," Optica, vol. 3, No. 8, dated Aug. 5, 2016, 4 pages.

Geng, "Structured-light 3D surface imaging: a tutorial," Advances in Optics and Photonics, Jun. 30, 2011, 3(2):128-160.

Gulden et al., "Novel optical distance sensor based on MSM technology." IEEE Sensors Journal. Oct. 2004, 4(5):612-8.

Joo et al., "High-sensitivity 10 Gbps Ge-on-Si photoreceiver operating at λ~1.55 μm," Optics Express, Aug. 2, 2010, 18(16):16474-16479.

Kato et al., "320×240 Back-Illuminated 10-μm CAPD Pixels for High-Speed Modulation Time-of-Flight CMOS Image Sensor," IEEE J. Solid-State Circuits Apr. 2018, 53(4):1071-1078.

Kawahito et al., "A CMOS Time-of-Flight Range Image Sensor With Gates-on-Field-Oxide Structure," IEEE Sensors J. Dec. 2007, 7(12):1578-1586.

Kim et al., "A Three-Dimensional Time-of-Flight CMOS Image Sensor With Pinned-Photodiode Pixel Structure," IEEE Electron. Dev. Lett., Nov. 2010, 31(11):1272-1274.

Koester et al., "Ge-on-SOI-Detector/Si-CMOS-Amplifier Receivers for High-Performance Optical-Communication Applications," J. Lightw. Technol., Jan. 2001, 25(1):46-57.

Lange et al., "Solid-State Time-of-Flight Range Camera," IEEE J. Quant. Electron. Mar. 2001, 37(3):390-397.

Li et al., "High-Bandwidth and High-Responsivity Top-Illuminated Germanium Photodiodes for Optical Interconnection," IEEE Trans. Electron Dev., Mar. 2013, 60(3):1183-1187.

Lischke et al., "High bandwidth, high responsivity waveguide-coupled germanium p-i-n photodiode," Optics Express, Oct. 19, 2015, 23(21):27213-27220.

Liu et al., "Backside-incidence critically coupled Ge on SOI photodetector," Proc. SPIE 10100, Optical Components and Materials, Feb. 16, 2017, XIV, 101001X, 6 pages.

Michel et al., "High-performance Ge-on-Si photodetectors," Nature Photon. Jul. 30, 2010, 4:527-534.

Morse et al., "Performance of Ge-on-Si p-i-n. Photodetectors for Standard Receiver Modules," IEEE Photon. Technol. Lett., Dec. 1, 2006, 18(23):2442-2444.

Perenzoni et al., "Compact SPAD-Based Pixel Architectures for Time-Resolved Image Sensors," Sensors, May 23, 2016, 16(5):745, 12 pages.

Place et al., "Rad tolerant CMOS image sensor based on hole collection 4T pixel pinned photodiode." IEEE Transactions on Nuclear Science. Dec. 6, 2012, 59(6):2888-93.

Rafferty et a., "Monolithic germanium SWIR imaging array," 2008 IEEE Conference on Technologies for Homeland Security, Waltham, MA, May 12, 2008, p. 577-582.

Ringbeck et al., "Multidimensional measurement by using 3-D PMD sensors," Adv. Radio Sci., Jan. 1, 2007, 5:135-146.

Tseng et al., "High-performance silicon-on-insulator grating coupler with completely vertical emission," Sep. 21, 2015, 23(19):24433-9.

Tseng et al., "A self-assembled microbonded germanium/silicon heterojunction photodiode for 25 Gb/s high-speed optical interconnects," Sci. Rep. Nov. 15, 2013, 3:3225, 6 pages.

Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017 46(4B):2377-2380.

Van Nieuwenhove et al., "Photonic Demodulator With Sensitivity Control," IEEE Sensors J. Mar. 2007, 7(3):317-318.

Wu et al., "A critically coupled Germanium photodetector under vertical illumination," Opt. Express, Dec. 31, 2012, 20(28):29338-29346.

Yin et al., "31GHz Ge n-i-p waveguide photodetectors on Silicon-on-Insulator substrate," Optics Express Oct. 17, 2007, 15(21):13965-13971.

Yokogawa et al., "IR sensitivity enhancement of CMOS Image Sensor with diffractive light trapping pixels," Sci. Rep. Jun. 19, 2017, 7(1):3832, 9 pages.

Zanuttigh et al: "ToF Depth Camera Components", Time-of-Flight and Structured Light Depth Cameras: Technology and Applications, dated May 24, 2016, pp. 31-33.

Extended European Search Report in European Application No. 16840192.5, dated Mar. 19, 2019, 7 pages.

Extended European Search Report in European Application No. 18189000.5. dated Apr. 2, 2019, 14 pages.

PCT International Preliminary Report on Patentability in International Appln. No. PCT/US2018/020262, dated Sep. 3, 2019, 11 pages.

Kang et al, "Monolithic Ge/Si Avalanche Photodiodes," IEEE Xplore, 2009, 3 pages.

Ramireza et al, "Recent progress on the quantum-dot avalanche photodiode," 22nd Annual Meeting of the IEEE Lasers and Electro-optics Society, Oct. 4, 2009, 2 pages.

* cited by examiner

HIGH-SPEED LIGHT SENSING APPARATUS

CROSS-REFERENCE TO RELATED APPLICATIONS

This patent application is a continuation application of and claims priority to U.S. application Ser. No. 16/146,656, filed on Sep. 28, 2018, which is a continuation application of and claims priority to U.S. application Ser. No. 15/338,660, filed on Oct. 31, 2016, now U.S. Pat. No. 10,254,389, which claims the benefit of U.S. Provisional Patent Application No. 62/251,691, filed Nov. 6, 2015, U.S. Provisional Patent Application No. 62/271,386, filed Dec. 28, 2015, U.S. Provisional Patent Application No. 62/294,436, filed Feb. 12, 2016, which are incorporated by reference herein.

BACKGROUND

This specification relates to detecting light using a photodiode.

Light propagates in free space or an optical medium is coupled to a photodiode that converts an optical signal to an electrical signal for processing.

SUMMARY

According to one innovative aspect of the subject matter described in this specification, light reflected from a three-dimensional object may be detected by photodiodes of an imaging system. The photodiodes convert the detected light into electrical charges. Each photodiode may include two groups of switches that collect the electrical charges. The collection of the electrical charges by the two groups of switches may be altered over time, such that the imaging system may determine phase information of the sensed light. The imaging system may use the phase information to analyze characteristics associated with the three-dimensional object including depth information or a material composition. The imaging system may also use the phase information to analyze characteristics associated with eye-tracking, gesture recognition, 3-dimensional model scanning/video recording, and/or augmented/virtual reality applications.

In general, one innovative aspect of the subject matter described in this specification can be embodied in an optical apparatus that includes a semiconductor substrate; a germanium-silicon layer coupled to the semiconductor substrate, the germanium-silicon layer including a photodiode region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, where the second control signal is different from the first control signal. The one or more first switches include a first p-doped region in the germanium-silicon layer, where the first p-doped region is controlled by the first control signal; and a first n-doped region in the germanium-silicon layer, where the first n-doped region is coupled to a first readout integrated circuit. The one or more second switches include a second p-doped region in the germanium-silicon layer, where the second p-doped region is controlled by the second control signal; and a second n-doped region in the germanium-silicon layer, where the second n-doped region is coupled to a second readout integrated circuit.

This and other implementations can each optionally include one or more of the following features. The germanium-silicon layer may include a third n-doped region and a fourth n-doped region, where at least a portion of the first p-doped region may be formed in the third n-doped region, and where at least a portion of the second p-doped region may be formed in the fourth n-doped region. The germanium-silicon layer may include a third n-doped region, where at least a portion of the first p-doped region and a portion of the second p-doped region may be formed in the third n-doped region. The semiconductor substrate may include a third p-doped region and one or more n-doped regions, where the germanium-silicon layer may be arranged over the third p-doped region, and where the third p-doped region may be electrically shorted with the one or more n-doped regions.

The first control signal may be a fixed bias voltage, and the second control signal may be a variable bias voltage that is biased over the fixed voltage of the first control signal. The photons absorbed by the germanium-silicon layer may be reflected from a surface of a three-dimensional target, and the portion of the photo-carriers collected by the one or more first switches and the portion of the photo-carriers collected by the one or more second switches may be utilized by a time-of-flight system to analyze depth information or a material composition of the three-dimensional target.

Another innovative aspect of the subject matter described in this specification can be embodied in an optical apparatus including a semiconductor substrate; an absorption layer coupled to the semiconductor substrate, the absorption layer including a photodiode region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, where the second control signal is different from the first control signal. The one or more first switches include a first p-doped region in the semiconductor substrate, where the first p-doped region is controlled by the first control signal; and a first n-doped region in the semiconductor substrate, where the first n-doped region is coupled to a first readout integrated circuit. The one or more second switches include a second p-doped region in the semiconductor substrate, where the second p-doped region is controlled by the second control signal; and a second n-doped region in the semiconductor substrate, wherein the second n-doped region is coupled to a second readout integrated circuit.

This and other implementations can each optionally include one or more of the following features. The semiconductor substrate may include a third n-doped region and a fourth n-doped region, where at least a portion of the first p-doped region may be formed in the third n-doped region, and where at least a portion of the second p-doped region may be formed in the fourth n-doped region. The semiconductor substrate may include a third n-doped region, where at least a portion of the first p-doped region and a portion of the second p-doped region may be formed in the third n-doped region. The semiconductor substrate may include one or more p-well regions.

The first control signal may be a fixed bias voltage, where the second control signal may be a variable bias voltage that is biased over the fixed voltage of the first control signal. The photons absorbed by the absorption layer may be reflected from a surface of a three-dimensional target, where the portion of the photo-carriers collected by the one or more first switches and the portion of the photo-carriers collected by the one or more second switches may be utilized by a time-of-flight system to analyze depth information or a material composition of the three-dimensional target.

Another innovative aspect of the subject matter described in this specification can be embodied in an optical apparatus including a semiconductor substrate; an absorption layer coupled to the semiconductor substrate, the absorption layer including a photodiode region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, where the second control signal is different from the first control signal. The one or more first switches include multiple first p-doped regions in the semiconductor substrate, where the multiple first p-doped regions are controlled by the first control signal; and multiple first n-doped regions in the semiconductor substrate, where the multiple first n-doped regions are coupled to a first readout integrated circuit. The one or more second switches include multiple second p-doped regions in the semiconductor substrate, where the multiple second p-doped regions are controlled by the second control signal; and multiple second n-doped regions in the semiconductor substrate, where the multiple second n-doped regions are coupled to a second readout integrated circuit.

This and other implementations can each optionally include one or more of the following features. The semiconductor substrate may include a third n-doped region, where at least a portion of the multiple first p-doped region and a portion of the multiple second p-doped region may be formed in the third n-doped region. The multiple first p-doped regions and the multiple second p-doped regions may be arranged in an interdigitated arrangement along a first plane in the semiconductor substrate, where the multiple first n-doped regions and the multiple second n-doped regions may be arranged in an interdigitated arrangement along a second plane in the semiconductor substrate that is different from the first plane. Each p-doped region of the multiple first p-doped regions may be arranged over a respective n-doped region of the multiple first n-doped regions, and each p-doped region of the multiple second p-doped regions may be arranged over a respective n-doped region of the multiple second n-doped regions. The semiconductor substrate may include one or more p-well regions.

The first control signal may be a fixed bias voltage, and the second control signal may be a variable bias voltage that is biased over the fixed voltage of the first control signal. The photons absorbed by the absorption layer may be reflected from a surface of a three-dimensional target, where the portion of the photo-carriers collected by the one or more first switches and the portion of the photo-carriers collected by the one or more second switches may be utilized by a time-of-flight system to analyze depth information or a material composition of the three-dimensional target.

Another innovative aspect of the subject matter described in this specification can be embodied in a time-of-flight system that includes a light source; and an image sensor comprising multiple pixels fabricated on a semiconductor substrate, where each pixel of the pixels includes a germanium-silicon layer coupled to the semiconductor substrate, the germanium-silicon layer including a photodiode region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, where the second control signal is different from the first control signal.

This and other implementations can each optionally include one or more of the following features. The light source may be configured to emit optical pulses having a duty cycle that is less than 50% but maintaining a same amount of energy per optical pulse.

Another innovative aspect of the subject matter described in this specification can be embodied in an optical apparatus that includes a semiconductor substrate; a germanium-silicon layer coupled to the semiconductor substrate, the germanium-silicon layer including a photodiode region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, where the second control signal is different from the first control signal. The one or more first switches include a first p-doped region in the germanium-silicon layer, where the first p-doped region is controlled by the first control signal; and a first n-doped region in the semiconductor substrate, where the first n-doped region is coupled to a first readout integrated circuit. The one or more second switches include a second p-doped region in the germanium-silicon layer, where the second p-doped region is controlled by the second control signal; and a second n-doped region in the semiconductor substrate, where the second n-doped region is coupled to a second readout integrated circuit.

This and other implementations can each optionally include one or more of the following features. The germanium-silicon layer may include a third n-doped region and a fourth n-doped region, where at least a portion of the first p-doped region is formed in the third n-doped region, and where at least a portion of the second p-doped region may be formed in the fourth n-doped region. The germanium-silicon layer may include a third n-doped region, where at least a portion of the first p-doped region and a portion of the second p-doped region may be formed in the third n-doped region. The semiconductor substrate may include one or more p-well regions.

The first control signal may be a fixed bias voltage, where the second control signal may be a variable bias voltage that is biased over the fixed voltage of the first control signal. The photons absorbed by the germanium-silicon layer may be reflected from a surface of a three-dimensional target, where the portion of the photo-carriers collected by the one or more first switches and the portion of the photo-carriers collected by the one or more second switches may be utilized by a time-of-flight system to analyze depth information or a material composition of the three-dimensional target.

Advantageous implementations may include one or more of the following features. Germanium is an efficient absorption material for near-infrared wavelengths, which reduces the problem of slow photo-carriers generated at a greater substrate depth when an inefficient absorption material, e.g., silicon, is used. For a photodiode having p- and n-doped regions fabricated at two different depths, the photo-carrier transit distance is limited by the depth, and not the width, of the absorption material. Consequently, if an efficient absorption material with a short absorption length is used, the distance between the p- and n-doped regions can also be made short so that even a small bias may create a strong field resulting into an increased operation speed. For such a photodiode, two groups of switches may be inserted and arranged laterally in an interdigitated arrangement, which may collect the photo-carriers at different optical phases for a time-of-flight system. An increased operation speed allows the use of a higher modulation frequency in a time-of-flight system, giving a greater depth resolution. In a time-of-flight system where the peak intensity of optical pulses is increased while the duty cycle of the optical pulses is decreased, the signal-to-noise ratio can be improved while maintaining the same power consumption for the time-of-flight system. This is made possible when the operation speed is increased so that the duty cycle of the optical pulses can be decreased without distorting the pulse shape.

The details of one or more implementations are set forth in the accompanying drawings and the description below. Other potential features and advantages will become apparent from the description, the drawings, and the claims.

BRIEF DESCRIPTION OF THE DRAWINGS

Like reference numbers and designations in the various drawings indicate like elements. It is also to be understood that the various exemplary embodiments shown in the figures are merely illustrative representations and are not necessarily drawn to scale.

DETAILED DESCRIPTION

Photodiodes may be used to detect optical signals and convert the optical signals to electrical signals that may be further processed by another circuitry. In time-of-flight (TOF) applications, depth information of a three-dimensional object may be determined using a phase difference between a transmitted light pulse and a detected light pulse. For example, a two-dimensional array of pixels may be used to reconstruct a three-dimensional image of a three-dimensional object, where each pixel may include one or more photodiodes for deriving phase information of the three-dimensional object. In some implementations, time-of-flight applications use light sources having wavelengths in the near-infrared (NIR) range. For example, a light-emitting-diode (LED) may have a wavelength of 850 nm, 940 nm or 1050 nm. Some photodiodes may use silicon as an absorption material, but silicon is an inefficient absorption material for NIR wavelengths. Specifically, photo-carriers may be generated deeply (e.g., greater than 10 µm in depth) in the silicon substrate, and those photo-carriers may drift and/or diffuse to the photodiode junction slowly, which results in a decrease in the operation speed. Moreover, a small voltage swing is typically used to control photodiode operations in order to minimize power consumption. For a large absorption area (e.g., 10 µm in diameter), the small voltage swing can only create a small lateral/vertical field across the large absorption area, which affects the drift velocity of the photo-carriers being swept across the absorption area. The operation speed is therefore further limited. For TOF applications using NIR wavelengths, a dual-switch photodiode with innovative design structures and/or with the use of germanium-silicon (GeSi) as an absorption material addresses the technical issues discussed above. In this application, the term "photodiode" may be used interchangeably with the term "optical sensor". In this application, the term "germanium-silicon (GeSi)" refers to a GeSi alloy with alloy composition ranging from more than 10% germanium (Ge), i.e., less than 90% silicon (Si), to 100% Ge, i.e., 0% of Si. In this application, the GeSi material may be grown using a blanket epitaxy, a selective epitaxy, or other applicable techniques. Furthermore, an absorption layer comprising the GeSi material may be formed on a planar surface, a mesa top surface, or a trench bottom surface at least partially surrounded by an insulator (ex: oxide, nitrite), a semiconductor (ex: Si, Ge), or their combinations. Furthermore, a strained super lattice structure or a multiple quantum well structure including alternative layers such as GeSi layers with two or more different alloy compositions may be used for the absorption layer.

Figure 1A:
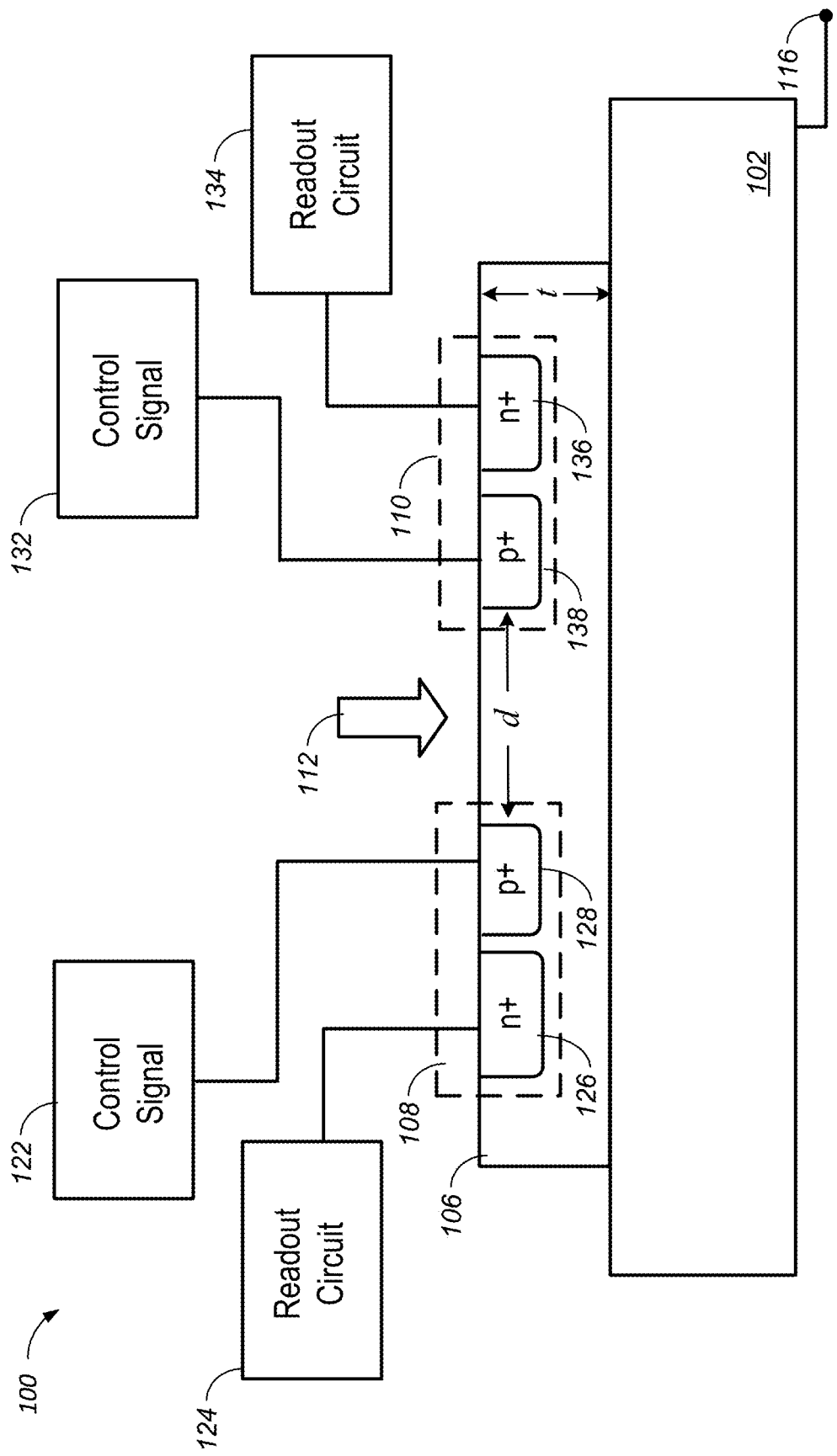
FIGS. 1A, 1B, 1C, and 1D are examples of a dual-switch photodiode.

FIG. 1A is an example dual-switch photodiode 100 for converting an optical signal to an electrical signal. The dual-switch photodiode 100 includes an absorption layer 106 fabricated on a substrate 102. The substrate 102 may be any suitable substrate where semiconductor devices can be fabricated on. For example, the substrate 102 may be a silicon substrate. The absorption layer 106 includes a first switch 108 and a second switch 110.

In general, the absorption layer 106 receives an optical signal 112 and converts the optical signal 112 into electrical signals. The absorption layer 106 is selected to have a high absorption coefficient at the desired wavelength range. For NIR wavelengths, the absorption layer 106 may be a GeSi mesa, where the GeSi absorbs photons in the optical signal 112 and generates electron-hole pairs. The material composition of germanium and silicon in the GeSi mesa may be selected for specific processes or applications. In some implementations, the absorption layer 106 is designed to have a thickness t. For example, for 850 nm wavelength, the thickness of the GeSi mesa may be approximately 1 µm to have a substantial quantum efficiency. In some implementations, the surface of the absorption layer 106 is designed to have a specific shape. For example, the GeSi mesa may be circular, square, or rectangular depending on the spatial profile of the optical signal 112 on the surface of the GeSi mesa. In some implementations, the absorption layer 106 is designed to have a lateral dimension d for receiving the optical signal 112. For example, the GeSi mesa may have a circular shape, where d can range from 1 µm to 50 µm.

A first switch 108 and a second switch 110 have been fabricated in the absorption layer 106. The first switch 108 is coupled to a first control signal 122 and a first readout circuit 124. The second switch 110 is coupled to a second control signal 132 and a second readout circuit 134. In general, the first control signal 122 and the second control signal 132 control whether the electrons or the holes generated by the absorbed photons are collected by the first readout circuit 124 or the second readout circuit 134.

In some implementations, the first switch 108 and the second switch 110 may be fabricated to collect electrons. In this case, the first switch 108 includes a p-doped region 128 and an n-doped region 126. For example, the p-doped region 128 may have a p+ doping, where the activated dopant concentration may be as high as a fabrication process may achieve, e.g., the peak concentration may be about $5 \times 10^{20}$ cm$^{-3}$ when the absorption layer 106 is germanium and doped with boron. In some implementation, the doping concentration of the p-doped region 128 may be lower than $5 \times 10^{20}$ cm$^{-3}$ to ease the fabrication complexity at the expense of an increased contact resistance. The n-doped region 126 may have an n+ doping, where the activated dopant concentration may be as high as a fabrication process may achieve, e.g., the peak concentration may be about $1 \times 10^{20}$ cm$^{-3}$ when the absorption layer 106 is germanium and doped with phosphorous. In some implementation, the doping concentration of the n-doped region 126 may be lower than $1 \times 10^{20}$ cm$^{-3}$ to ease the fabrication complexity at the expense of an increased contact resistance. The distance between the p-doped region 128 and the n-doped region 126 may be designed based on fabrication process design rules. In general, the closer the distance between the p-doped region 128 and the n-doped region 126, the higher the switching efficiency of the generated photo-carriers. The second switch 110 includes a p-doped region 138 and an n-doped region 136. The p-doped region 138 is similar to the p-doped region 128, and the n-doped region 136 is similar to the n-doped region 126.

In some implementations, the p-doped region 128 is coupled to the first control signal 122. For example, the p-doped region 128 may be coupled to a voltage source, where the first control signal 122 may be an AC voltage signal from the voltage source. In some implementations, the n-doped region 126 is coupled to the readout circuit 124. The readout circuit 124 may be in a three-transistor configuration consisting of a reset gate, a source-follower, and a selection gate, or any suitable circuitry for processing charges. In some implementations, the readout circuit 124 may be fabricated on the substrate 102. In some other implementations, the readout circuit 124 may be fabricated on another substrate and integrated/co-packaged with the dual-switch photodiode 100 via die/wafer bonding or stacking.

The p-doped region 138 is coupled to the second control signal 132. For example, the p-doped region 138 may be coupled to a voltage source, where the second control signal 132 may be an AC voltage signal having an opposite phase from the first control signal 122. In some implementations, the n-doped region 136 is coupled to the readout circuit 134. The readout circuit 134 may be similar to the readout circuit 124.

The first control signal 122 and the second control signal 132 are used to control the collection of electrons generated by the absorbed photons. For example, when voltages are used, if the first control signal 122 is biased against the second control signal 132, an electric field is created between the p-doped region 128 and the p-doped region 138, and free electrons drift towards the p-doped region 128 or the p-doped region 138 depending on the direction of the electric field. In some implementations, the first control signal 122 may be fixed at a voltage value V1, and the second control signal 132 may alternate between voltage values $V_i \pm \Delta V$. The direction of the bias value determines the drift direction of the electrons. Accordingly, when one switch (e.g., the first switch 108) is switched "on" (i.e., the electrons drift towards the p-doped region 128), the other switch (e.g., the second switch 110) is switched "off" (i.e. the electrons are blocked from the p-doped region 138). In some implementations, the first control signal 122 and the second control signal 132 may be voltages that are differential to each other.

In general, a difference between the Fermi level of a p-doped region and the Fermi level of an n-doped region creates an electric field between the two regions. In the first switch 108, an electric field is created between the p-doped region 128 and the n-doped region 126. Similarly, in the second switch 110, an electric field is created between the p-doped region 138 and the n-doped region 136. When the first switch 108 is switched "on" and the second switch 110 is switched "off", the electrons are attracted by the p-doped region 128, and the electric field between the p-doped region 128 and the n-doped region 126 further carries the electrons to the n-doped region 126. The readout circuit 124 may then be enabled to process the charges collected by the n-doped region 126. On the other hand, when the second switch 110 is switched "on" and the first switch 108 is switched "off", the electrons are collected by the p-doped region 138, and the electric field between the p-doped region 138 and the n-doped region 136 further carries the electrons to the n-doped region 136. The readout circuit 134 may then be enabled to process the charges collected by the n-doped region 136.

In some implementations, a voltage may be applied between the p-doped and the n-doped regions of a switch to operate the switch in an avalanche regime to increase the sensitivity of the dual-switch photodiode 100. For example, when the distance between the p-doped region 128 and the n-doped region 126 is about 100 nm, it is possible to apply a voltage that is less than 7 V to create an avalanche gain between the p-doped region 128 and the n-doped region 126.

In some implementations, the substrate 102 may be coupled to an external control 116. For example, the substrate 102 may be coupled to ground. In some other implementations, the substrate 102 may be floated and not coupled to any external control.

Figure 1B:
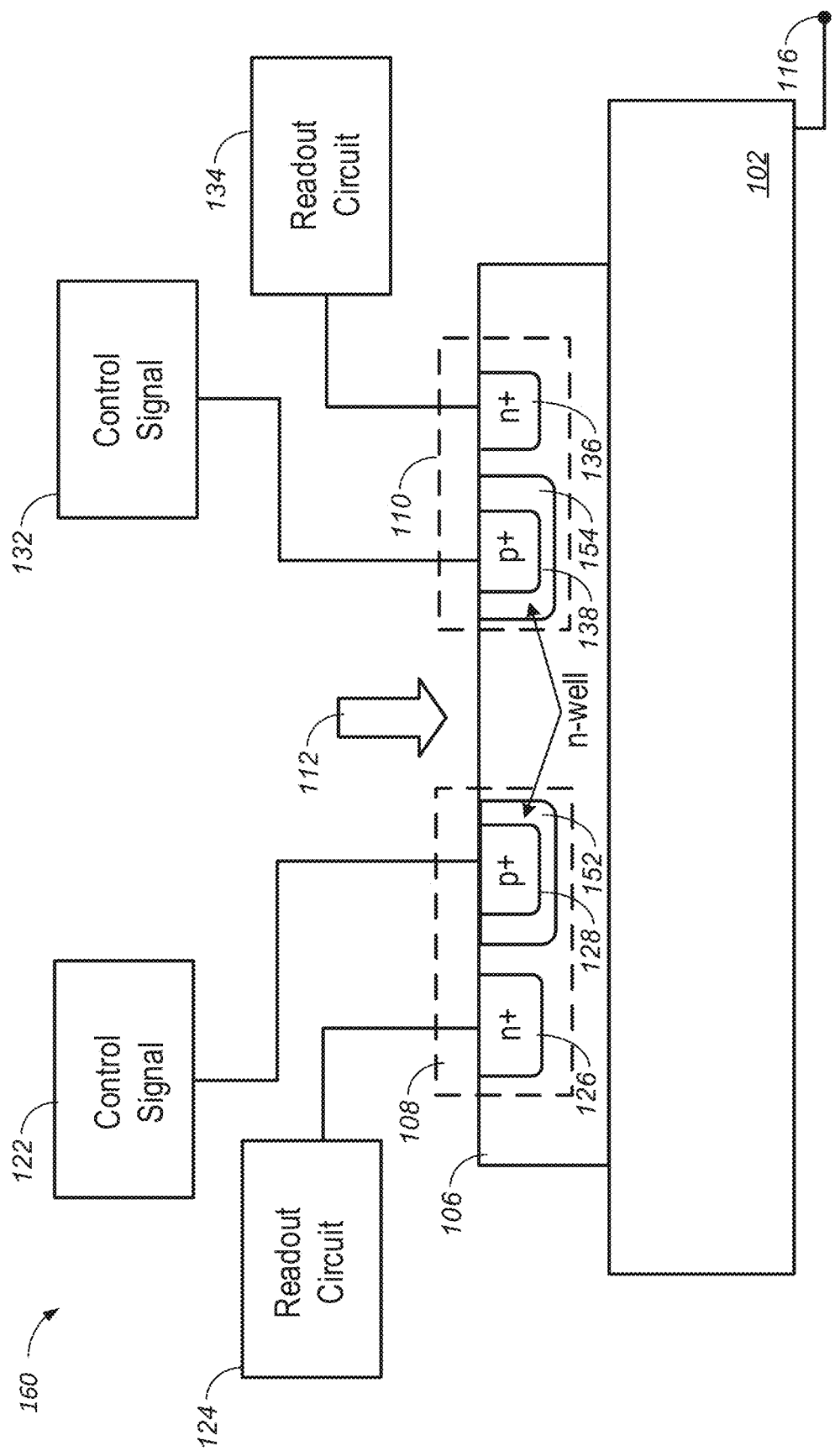

FIG. 1B is an example dual-switch photodiode 160 for converting an optical signal to an electrical signal. The dual-switch photodiode 160 is similar to the dual-switch photodiode 100 in FIG. 1A, but that the first switch 108 and the second switch 110 further includes an n-well region 152 and an n-well region 154, respectively. In addition, the absorption layer 106 may be a p-doped region. In some implementations, the doping level of the n-well regions 152 and 154 may range from $10^{15}$ cm$^{-3}$ to $10^{17}$ cm$^{-3}$. The doping level of the absorption layer 106 may range from $10^{14}$ cm$^{-3}$ to $10^{16}$ cm$^{-3}$.

The arrangement of the p-doped region 128, the n-well region 152, the p-doped absorption layer 106, the n-well region 154, and the p-doped region 138 forms a PNPNP junction structure. In general, the PNPNP junction structure reduces a conduction current from the first control signal 122 to the second control signal 132, or alternatively from the second control signal 132 to the first control signal 122. The arrangement of the n-doped region 126, the p-doped absorption layer 106, and the n-doped region 136 forms an NPN junction structure. In general, the NPN junction structure reduces a charge coupling from the first readout circuit 124 to the second readout circuit 134, or alternatively from the second readout circuit 134 to the first readout circuit 124.

In some implementations, the p-doped region 128 is formed entirely within the n-well region 152. In some other implementations, the p-doped region 128 is partially formed in the n-well region 152. For example, a portion of the p-doped region 128 may be formed by implanting the p-dopants in the n-well region 152, while another portion of the p-doped region 128 may be formed by implanting the p-dopants in the absorption layer 106. Similarly, in some implementations, the p-doped region 138 is formed entirely within the n-well region 154. In some other implementations, the p-doped region 138 is partially formed in the n-well region 154.

Figure 1C:
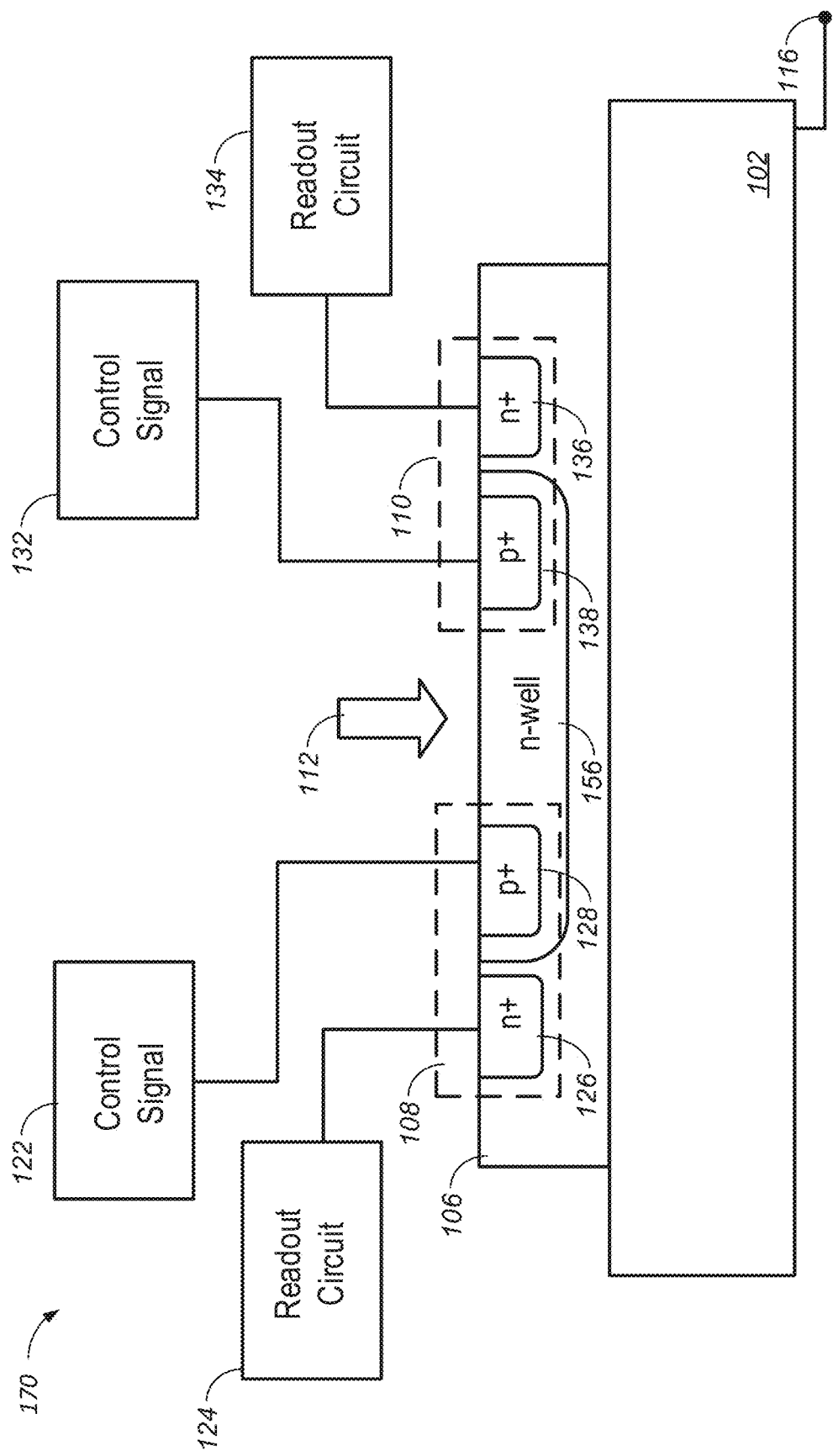

FIG. 1C is an example dual-switch photodiode 170 for converting an optical signal to an electrical signal. The dual-switch photodiode 170 is similar to the dual-switch photodiode 100 in FIG. 1A, but that the absorption layer 106 further includes an n-well region 156. In addition, the absorption layer 106 may be a p-doped region. In some implementations, the doping level of the n-well region 156 may range from $10^{15}$ cm$^{-3}$ to $10^{17}$ cm$^{-3}$. The doping level of the absorption layer 106 may range from $10^{14}$ cm$^{-3}$ to $10^{16}$ cm$^{-3}$.

The arrangement of the p-doped region 128, the n-well region 156, and the p-doped region 138 forms a PNP junction structure. In general, the PNP junction structure reduces a conduction current from the first control signal 122 to the second control signal 132, or alternatively from the second control signal 132 to the first control signal 122. The arrangement of the n-doped region 126, the p-doped absorption layer 106, and the n-doped region 136 forms an NPN junction structure. In general, the NPN junction structure reduces a charge coupling from the first readout circuit 124 to the second readout circuit 134, or alternatively from the second readout circuit 134 to the first readout circuit 124. In some implementations, if the depth of the n-well region 156 is deep, the arrangement of the n-doped region 126, the p-doped absorption layer 106, the n-well region 156, the p-doped absorption layer 106, and the n-doped region 136 forms an NPNPN junction structure, which further reduces a charge coupling from the first readout circuit 124 to the second readout circuit 134, or alternatively from the second readout circuit 134 to the first readout circuit 124.

In some implementations, the p-doped regions 128 and 138 are formed entirely within the n-well region 156. In some other implementations, the p-doped region 128 and 138 are partially formed in the n-well region 156. For example, a portion of the p-doped region 128 may be formed by implanting the p-dopants in the n-well region 156, while another portion of the p-doped region 128 may be formed by implanting the p-dopants in the absorption layer 106.

Figure 1D:
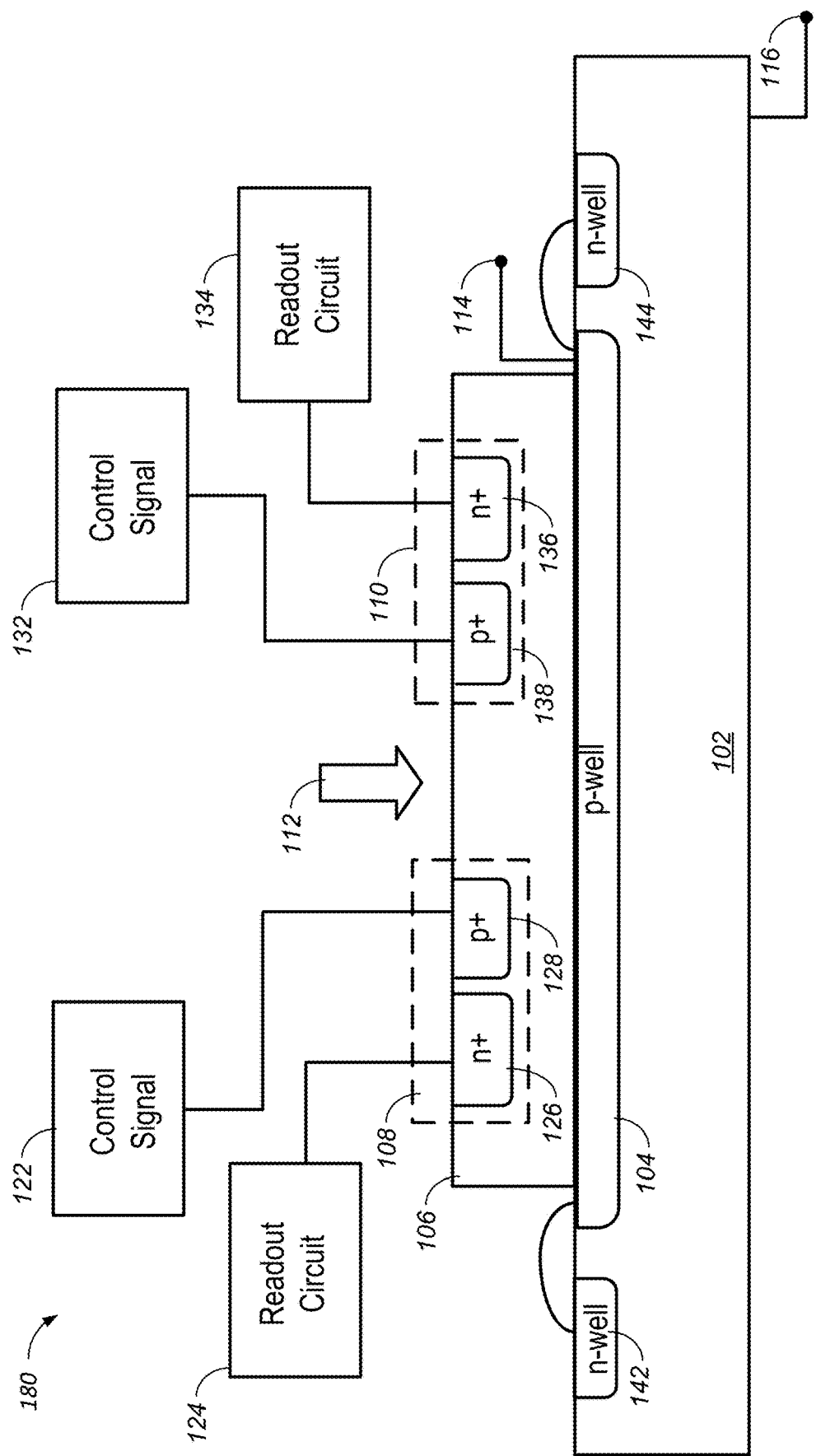

FIG. 1D is an example dual-switch photodiode 180 for converting an optical signal to an electrical signal. The dual-switch photodiode 180 is similar to the dual-switch photodiode 100 in FIG. 1A, but that the dual-switch photodiode 150 further includes a p-well region 104 and n-well regions 142 and 144. In some implementations, the doping level of the n-well regions 142 and 144 may range from $10^{16}$ cm$^{-3}$ to $10^{20}$ cm$^{-3}$. The doping level of the p-well region 104 may range from $10^{16}$ cm$^{-3}$ to $10^{20}$ cm$^{-3}$.

In some implementation, the absorption layer 106 may not completely absorb the incoming photons in the optical signal 112. For example, if the GeSi mesa does not completely absorb the incoming photons in the NIR optical signal 112, the NIR optical signal 112 may penetrate into the silicon substrate 102, where the silicon substrate 102 may absorb the penetrated photons and generate photo-carriers deeply in the substrate that are slow to recombine. These slow photo-carriers negatively affect the operation speed of the dual-switch photodiode.

To further remove the slow photo-carriers, the dual-switch photodiode 150 may include connections that short the n-well regions 142 and 144 with the p-well region 104. For example, the connections may be formed by a silicide process or a deposited metal pad that connects the n-well regions 142 and 144 with the p-well region 104. The shorting between the n-well regions 142 and 144 and the p-well region 104 allows the photo-carriers generated in the substrate 102 to be recombined at the shorted node, and therefore improves the operation speed of the dual-switch photodiode. In some implementation, the p-well region 104 is used to minimize the electric field around the interfacial defects between the absorptive layer 106 and the substrate 102 in order to reduce the device leakage current.

Although not shown in FIGS. 1A-1D, in some implementations, an optical signal may reach to the dual-switch photodiode from the backside of the substrate 102. One or more optical components may be fabricated on the backside of the substrate 102 to focus, collimate, defocus, filter, or otherwise manipulate the optical signal.

Although not shown in FIGS. 1A-1D, in some other implementations, the first switch 108 and the second switch 110 may alternatively be fabricated to collect holes instead of electrons. In this case, the p-doped region 128 and the p-doped region 138 would be replaced by n-doped regions, and the n-doped region 126 and the n-doped region 136 would be replaced by p-doped regions. The n-well regions 142, 144, 152, 154, and 156 would be replaced by p-well regions. The p-well region 104 would be replaced by an n-well region.

Although not shown in FIGS. 1A-1D, in some implementations, the absorption layer 106 may be bonded to a substrate after the fabrication of the dual-switch photodiode 100, 160, 170, and 180. The substrate may be any material that allows the transmission of the optical signal 112 to reach to the dual-switch photodiode. For example, the substrate may be polymer or glass. In some implementations, one or more optical components may be fabricated on the carrier substrate to focus, collimate, defocus, filter, or otherwise manipulate the optical signal 112.

Although not shown in FIGS. 1A-1D, in some implementations, the dual-switch photodiode 100, 160, 170, and 180 may be bonded (ex: metal to metal bonding, oxide to oxide bonding, hybrid bonding) to a second substrate with circuits including control signals, and/or, readout circuits, and/or phase lock loop (PLL), and/or analog to digital converter (ADC). A metal layer may be deposited on top of the dual-switch photodiode that may be used as a reflector to reflect the optical signal incident from the backside. An oxide layer may be included between the metal layer and the absorptive layer to increase the reflectivity. The metal layer may also be used as the bonding layer for the wafer-bonding process. In some implementations, one or more switches similar to 108 and 110 can be added for interfacing control signals/readout circuits.

Although not shown in FIG. 1A-1D, in some implementations, the absorption layer 106 may be partially or fully embedded/recessed in the substrate 102 to relieve the surface topography and so ease the fabrication process. An example of the embedment technique is described in U.S. patent application Ser. No. 15/228,282 titled "Germanium-Silicon Light Sensing Apparatus," which is fully incorporated by reference herein.

Figure 2A:
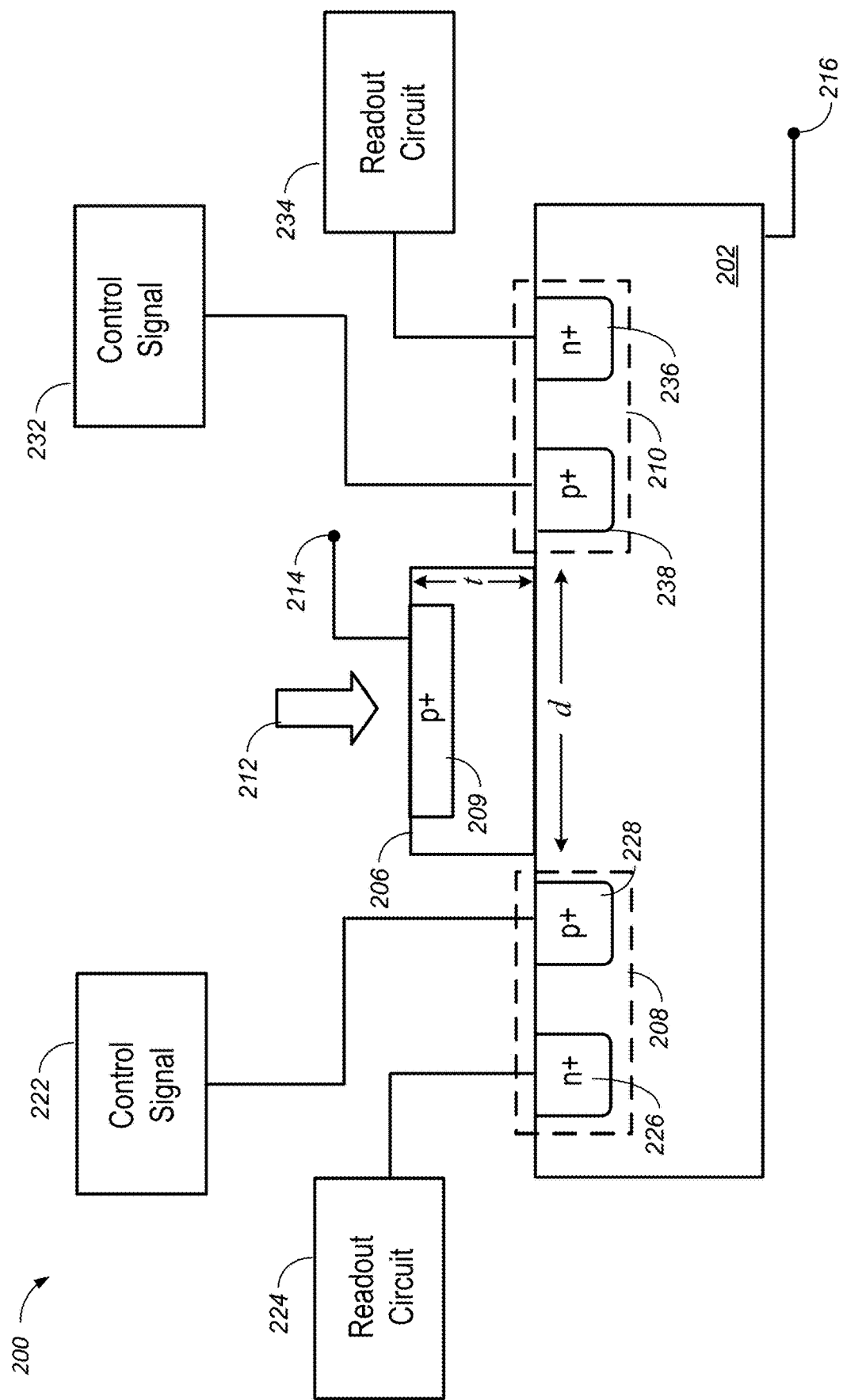
FIGS. 2A, 2B, 2C and 2D are examples of a dual-switch photodiode.

FIG. 2A is an example dual-switch photodiode 200 for converting an optical signal to an electrical signal, where the first switch 208 and the second switch 210 are fabricated on a substrate 202. The dual-switch photodiode 200 includes an absorption layer 206 fabricated on a substrate 202. The substrate 202 may be any suitable substrate where semiconductor devices can be fabricated on. For example, the substrate 202 may be a silicon substrate.

In general, the absorption layer 206 receives an optical signal 212 and converts the optical signal 212 into electrical signals. The absorption layer 206 is similar to the absorption layer 106. In some implementations, the absorption layer 206 may include a p-doped region 209. The p-doped region 209 may repel the photo-electrons from the absorption layer 206 to the substrate 202 and thereby increase the operation speed. For example, the p-doped region 209 may have a p+ doping, where the dopant concentration is as high as a fabrication process may achieve, e.g., the peak concentration may be about $5 \times 10^{20}$ cm$^{-3}$ when the absorption layer 206 is germanium and doped with boron. In some implementation, the doping concentration of the p-doped region 209 may be lower than $5 \times 10^{20}$ cm$^{-3}$ to ease the fabrication complexity at the expense of an increased contact resistance.

A first switch 208 and a second switch 210 have been fabricated in the substrate 202. The first switch 208 is coupled to a first control signal 222 and a first readout circuit 224. The second switch 210 is coupled to a second control signal 232 and a second readout circuit 234. In general, the first control signal 222 and the second control signal 232 control whether the electrons or the holes generated by the absorbed photons are collected by the first readout circuit 224 or the second readout circuit 234. The first control signal 222 is similar to the first control signal 122. The second control signal 232 is similar to the second control signal 132. The first readout circuit 224 is similar to the first readout circuit 124. The second readout circuit 234 is similar to the second readout circuit 134.

In some implementations, the first switch 208 and the second switch 210 may be fabricated to collect electrons generated by the absorption layer 206. In this case, the first switch 208 includes a p-doped region 228 and an n-doped region 226. For example, the p-doped region 228 may have a p+ doping, where the activated dopant concentration may be as high as a fabrication process may achieve, e.g., the peak concentration may be about $2 \times 10^{20}$ cm$^{-3}$ when the substrate 202 is silicon and doped with boron. In some implementation, the doping concentration of the p-doped region 228 may be lower than $2 \times 10^{20}$ cm$^{-3}$ to ease the fabrication complexity at the expense of an increased contact resistance. The n-doped region 226 may have an n+ doping, where the activated dopant concentration may be as high as a fabrication process may achieve, e.g., the peak concentration may be about $5 \times 10^{20}$ cm$^{-3}$ when the substrate 202 is silicon and doped with phosphorous. In some implementation, the doping concentration of the n-doped region 226 may be lower than $5 \times 10^{20}$ cm$^{-3}$ to ease the fabrication complexity at the expense of an increased contact resistance. The distance between the p-doped region 228 and the n-doped region 226 may be designed based on fabrication process design rules. In general, the closer the distance between the p-doped region 228 and the n-doped region 226, the higher the switching efficiency of the generated photo-carriers. The second switch 210 includes a p-doped region 238 and an n-doped region 236. The p-doped region 238 is similar to the p-doped region 228, and the n-doped region 236 is similar to the n-doped region 226.

In some implementations, the p-doped region 228 is coupled to the first control signal 222. The n-doped region 226 is coupled to the readout circuit 224. The p-doped region 238 is coupled to the second control signal 232. The n-doped region 236 is coupled to the readout circuit 234. The first control signal 222 and the second control signal 232 are used to control the collection of electrons generated by the absorbed photons. For example, when the absorption layer 206 absorbs photons in the optical signal 212, electron-hole pairs are generated and drift or diffuse into the substrate 202. When voltages are used, if the first control signal 222 is biased against the second control signal 232, an electric field is created between the p-doped region 228 and the p-doped region 238, and free electrons from the absorption layer 206 drift towards the p-doped region 228 or the p-doped region 238 depending on the direction of the electric field. In some implementations, the first control signal 222 may be fixed at a voltage value $V_i$, and the second control signal 232 may alternate between voltage values $V_i \pm \Delta V$. The direction of the bias value determines the drift direction of the electrons. Accordingly, when one switch (e.g., the first switch 208) is switched "on" (i.e., the electrons drift towards the p-doped region 228), the other switch (e.g., the second switch 210) is switched "off" (i.e., the electrons are blocked from the p-doped region 238). In some implementations, the first control signal 222 and the second control signal 232 may be voltages that are differential to each other.

In the first switch 208, an electric field is created between the p-doped region 228 and the n-doped region 226. Similarly, in the second switch 210, an electric field is created between the p-doped region 238 and the n-doped region 236. When the first switch 208 is switched "on" and the second switch 210 is switched "off", the electrons are attracted by the p-doped region 228, and the electric field between the p-doped region 228 and the n-doped region 226 further carries the electrons to the n-doped region 226. The readout circuit 224 may then be enabled to process the charges collected by the n-doped region 226. On the other hand, when the second switch 210 is switched "on" and the first switch 208 is switched "off", the electrons are attracted by the p-doped region 238, and the electric field between the p-doped region 238 and the n-doped region 236 further carries the electrons to the n-doped region 236. The readout circuit 234 may then be enabled to process the charges collected by the n-doped region 236.

In some implementations, a voltage may be applied between the p-doped and the n-doped regions of a switch to operate the switch in an avalanche regime to increase the sensitivity of the dual-switch photodiode 200. For example, when the distance between the p-doped region 228 and the n-doped region 226 is about 100 nm, it is possible to apply a voltage that is less than 7 V to create an avalanche gain between the p-doped region 228 and the n-doped region 226.

In some implementations, the p-doped region 209 may be coupled to an external control 214. For example, the p-doped region 209 may be coupled to ground. In some implementations, the p-doped region 209 may be floated and not coupled to any external control. In some implementations, the substrate 202 may be coupled to an external control 216. For example, the substrate 202 may be coupled to ground. In some other implementations, the substrate 202 may be floated and not coupled to any external control.

Figure 2B:
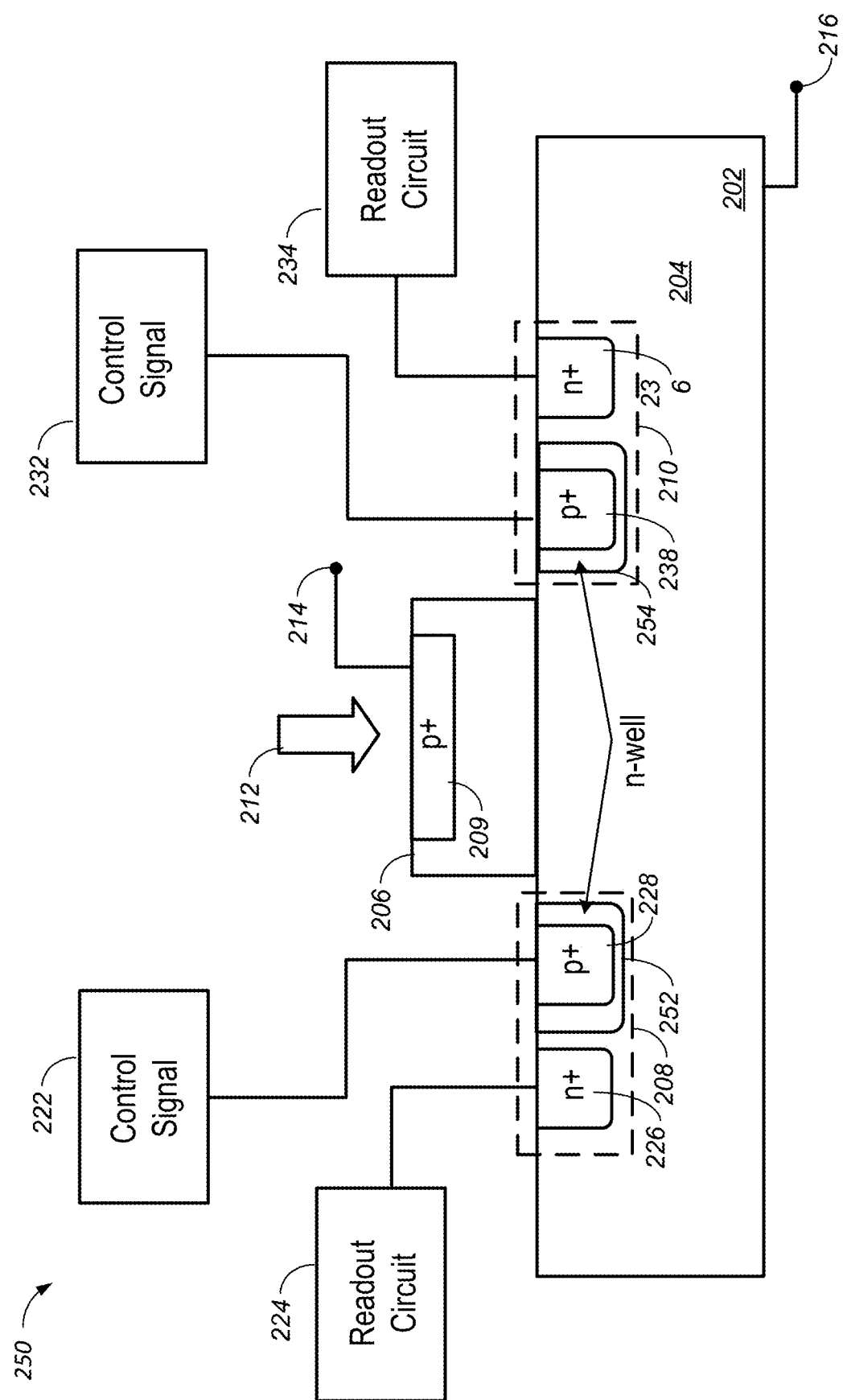

FIG. 2B is an example dual-switch photodiode 250 for converting an optical signal to an electrical signal. The dual-switch photodiode 250 is similar to the dual-switch photodiode 200 in FIG. 2A, but that the first switch 208 and the second switch 210 further includes an n-well region 252 and an n-well region 254, respectively. In addition, the absorption layer 206 may be a p-doped region and the substrate 202 may be a p-doped substrate. In some implementations, the doping level of the n-well regions 252 and 254 may range from $10^{15}$ cm$^{-3}$ to $10^{17}$ cm$^{-3}$. The doping level of the absorption layer 206 and the substrate 202 may range from $10^{14}$ cm$^{-3}$ to $10^{16}$ cm$^{-3}$.

The arrangement of the p-doped region 228, the n-well region 252, the p-doped substrate 202, the n-well region 254, and the p-doped region 238 forms a PNPNP junction structure. In general, the PNPNP junction structure reduces a conduction current from the first control signal 222 to the second control signal 232, or alternatively from the second control signal 232 to the first control signal 222. The arrangement of the n-doped region 226, the p-doped substrate 202, and the n-doped region 236 forms an NPN junction structure. In general, the NPN junction structure reduces a charge coupling from the first readout circuit 224 to the second readout circuit 234, or alternatively from the second readout circuit 234 to the first readout circuit 224.

In some implementations, the p-doped region 228 is formed entirely within the n-well region 252. In some other implementations, the p-doped region 228 is partially formed in the n-well region 252. For example, a portion of the p-doped region 228 may be formed by implanting the p-dopants in the n-well region 252, while another portion of the p-doped region 228 may be formed by implanting the p-dopants in the substrate 202. Similarly, in some implementations, the p-doped region 238 is formed entirely within the n-well region 254. In some other implementations, the p-doped region 238 is partially formed in the n-well region 254.

Figure 2C:
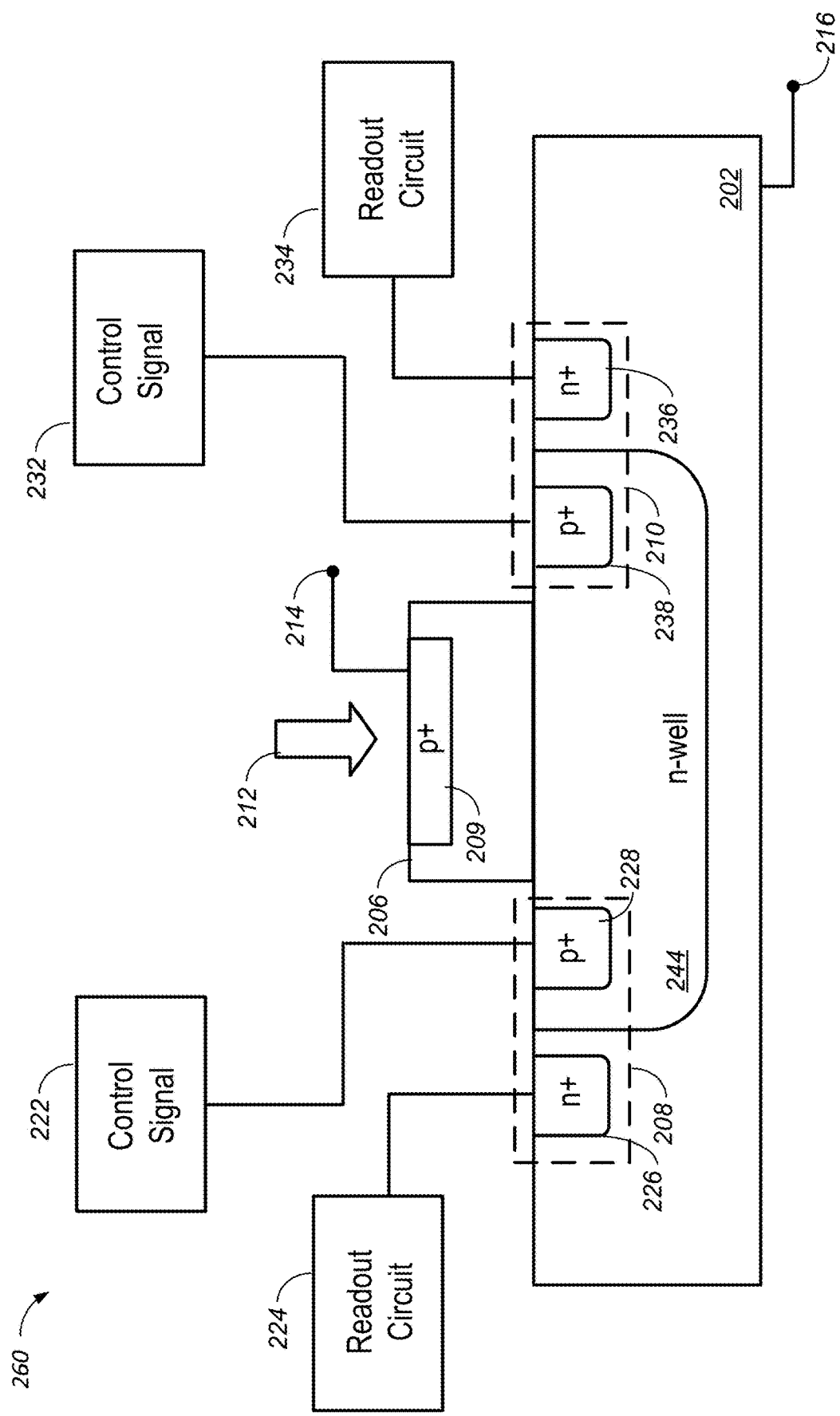

FIG. 2C is an example dual-switch photodiode 260 for converting an optical signal to an electrical signal. The dual-switch photodiode 260 is similar to the dual-switch photodiode 200 in FIG. 2A, but that the substrate 202 further includes an n-well region 244. In addition, the absorption layer 206 may be a p-doped region and the substrate 202 may be a p-doped substrate. In some implementations, the doping level of the n-well region 244 may range from $10^{15}$ cm$^{-3}$ to $10^{17}$ cm$^{-3}$. The doping level of the absorption layer 206 and the substrate 202 may range from $10^{14}$ cm$^{-3}$ to $10^{16}$ cm$^{-3}$.

The arrangement of the p-doped region 228, the n-well region 244, and the p-doped region 238 forms a PNP junction structure. In general, the PNP junction structure reduces a conduction current from the first control signal 222 to the second control signal 232, or alternatively from the second control signal 232 to the first control signal 222. The arrangement of the n-doped region 226, the p-doped substrate 202, and the n-doped region 236 forms an NPN junction structure. In general, the NPN junction structure reduces a charge coupling from the first readout circuit 224 to the second readout circuit 234, or alternatively from the second readout circuit 234 to the first readout circuit 224. In some implementations, if the depth of the n-well 244 is deep, the arrangement of the n-doped region 226, the p-doped substrate 202, the n-well region 244, the p-doped substrate 202, and the n-doped region 236 forms an NPNPN junction structure, which further reduces a charge coupling from the first readout circuit 224 to the second readout circuit 234, or alternatively from the second readout circuit 234 to the first readout circuit 224. In some implementations, the n-well region 244 also effectively reduces the potential energy barrier perceived by the electrons flowing from the absorption layer 206 to the substrate 202.

In some implementations, the p-doped regions 228 and 238 are formed entirely within the n-well region 244. In some other implementations, the p-doped regions 228 and 238 are partially formed in the n-well region 244. For example, a portion of the p-doped region 228 may be formed by implanting the p-dopants in the n-well region 244, while another portion of the p-doped region 228 may be formed by implanting the p-dopants in the substrate 202.

Figure 2D:
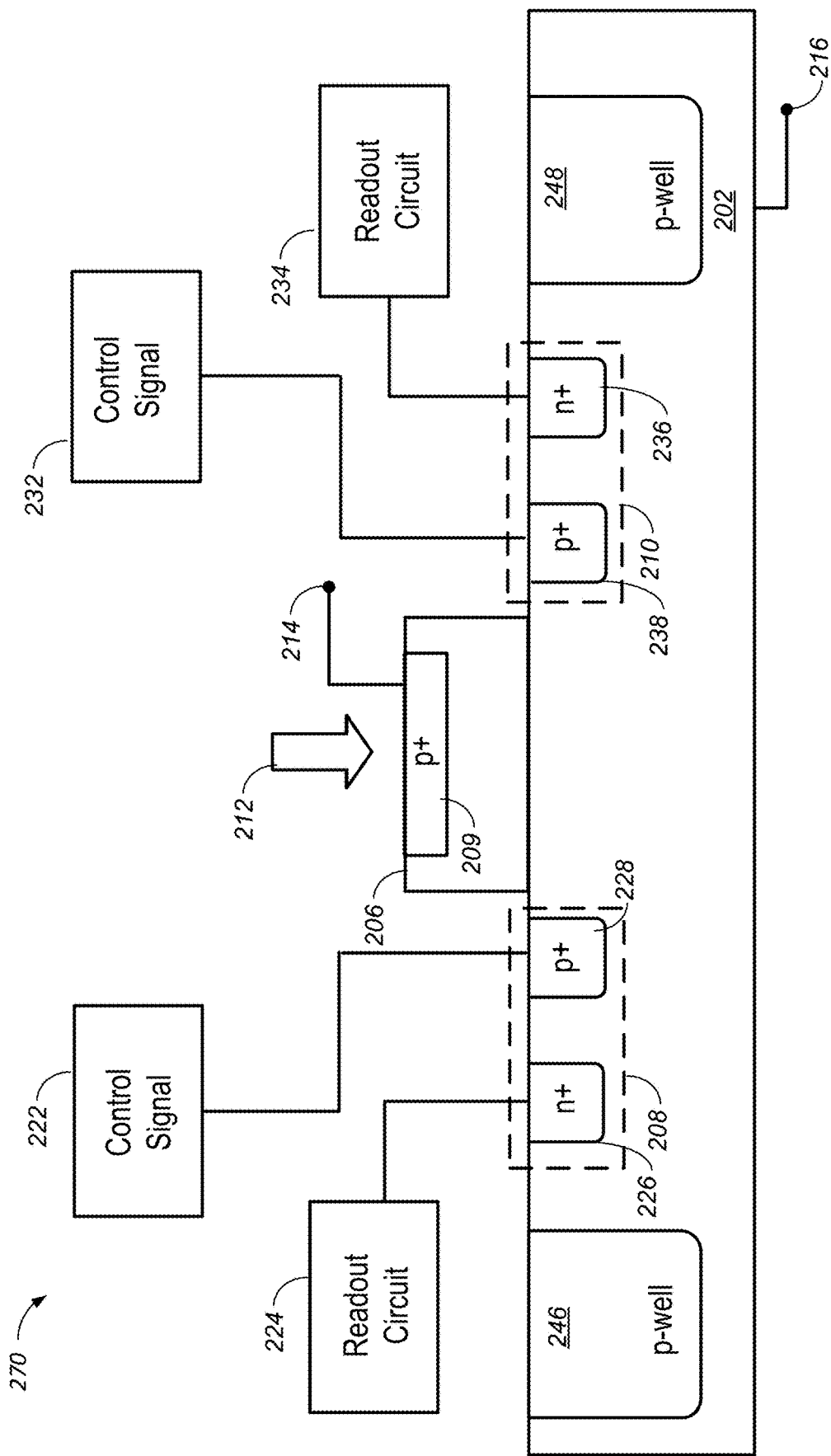

FIG. 2D is an example dual-switch photodiode 270 for converting an optical signal to an electrical signal. The dual-switch photodiode 270 is similar to the dual-switch photodiode 200 in FIG. 2A, but that the dual-switch photodiode 270 further includes one or more p-well regions 246 and one or more p-well regions 248. In some implementations, the one or more p-well regions 246 and the one or more p-well regions 248 may be part of a ring structure that surrounds the first switch 208 and the second switch 210. In some implementations, the doping level of the one or more p-well regions 246 and 248 may range from $10^{15}$ cm$^{-3}$ to $10^{20}$ cm$^{-3}$. The one or more p-well regions 246 and 248 may be used as an isolation of photo-electrons from the neighboring pixels.

Although not shown in FIG. 2A-2D, in some implementations, an optical signal may reach to the dual-switch photodiode from the backside of the substrate 202. One or more optical components may be fabricated on the backside of the substrate 202 to focus, collimate, defocus, filter, or otherwise manipulate the optical signal.

Although not shown in FIG. 2A-2D, in some other implementations, the first switch 208 and the second switch 210 may alternatively be fabricated to collect holes instead of electrons. In this case, the p-doped region 228, the p-doped region 238, and the p-doped region 209 would be replaced by n-doped regions, and the n-doped region 226 and the n-doped region 236 would be replaced by p-doped regions. The n-well regions 252, 254, and 244 would be replaced by p-well regions. The p-well regions 246 and 248 would be replaced by n-well regions.

Although not shown in FIG. 2A-2D, in some implementations, the absorption layer 206 may be bonded to a substrate after the fabrication of the dual-switch photodiode 200, 250, 260, and 270. The carrier substrate may be any material that allows the transmission of the optical signal 212 to reach to the dual-switch photodiode. For example, the substrate may be polymer or glass. In some implementations, one or more optical components may be fabricated on the carrier substrate to focus, collimate, defocus, filter, or otherwise manipulate the optical signal 212.

Although not shown in FIGS. 2A-2D, in some implementations, the dual-switch photodiode 200, 250, 260, and 270 may be bonded (ex: metal to metal bonding, oxide to oxide bonding, hybrid bonding) to a second substrate with circuits including control signals, and/or, readout circuits, and/or phase lock loop (PLL), and/or analog to digital converter (ADC). A metal layer may be deposited on top of the dual-switch photodiode that may be used as a reflector to reflect the optical signal incident from the backside. An oxide layer may be included between the metal layer and the absorptive layer to increase the reflectivity. The metal layer may also be used as the bonding layer for the wafer-bonding process. In some implementations, one or more switches similar to 208 and 210 can be added for interfacing control signals/readout circuits.

Although not shown in FIG. 2A-2D, in some implementations, the absorption layer 206 may be partially or fully embedded/recessed in the substrate 202 to relieve the surface topography and so ease the fabrication process. An example of the embedment technique is described in U.S. patent application Ser. No. 15/228,282 titled "Germanium-Silicon Light Sensing Apparatus," which is fully incorporated by reference herein.

Figure 3A:
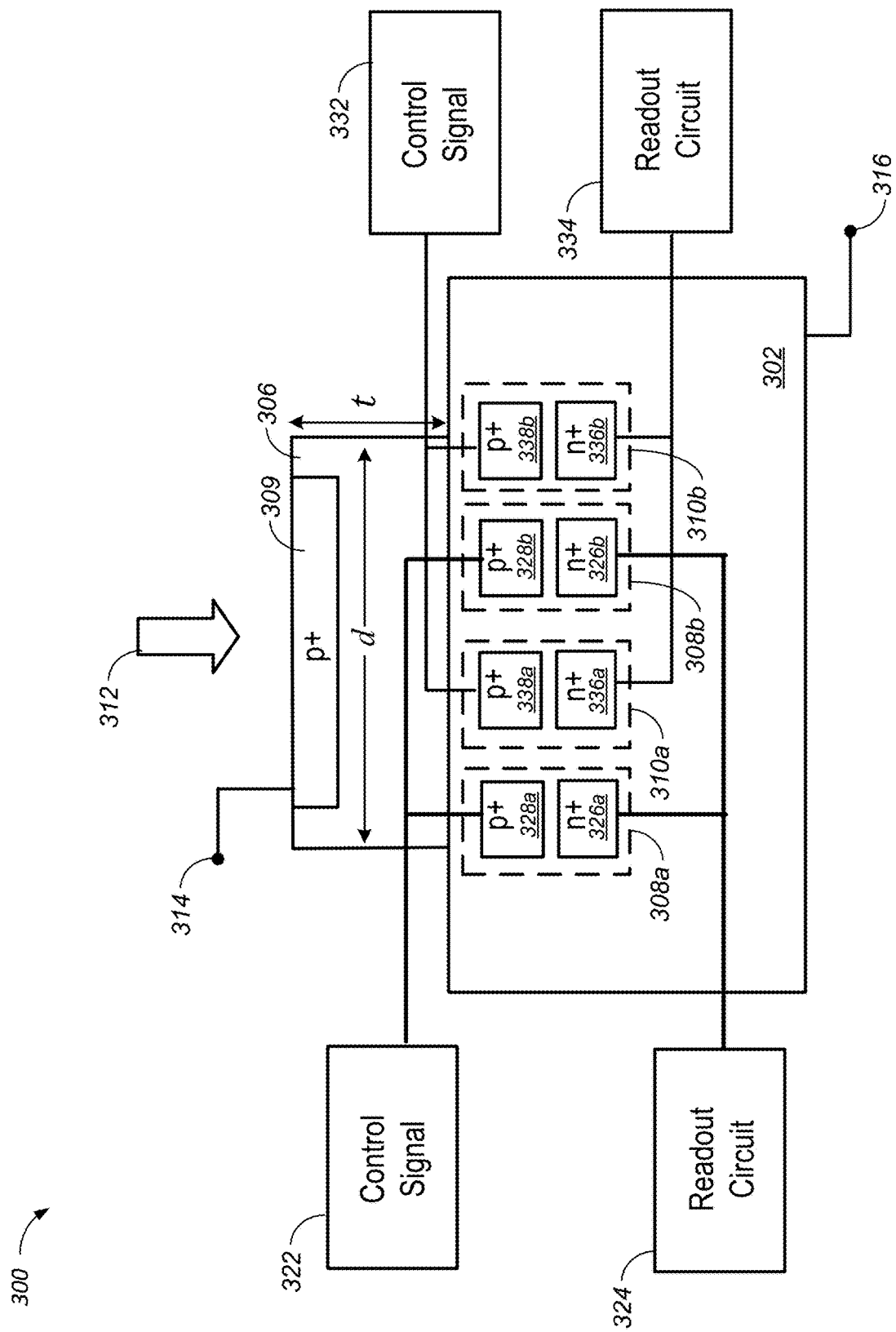
FIGS. 3A, 3B, 3C, and 3D are examples of a dual-switch photodiode.

FIG. 3A is an example dual-switch photodiode 300 for converting an optical signal to an electrical signal, where first switches 308a and 308b, and second switch 310a and 310b are fabricated in a vertical arrangement on a substrate 302. One characteristic with the dual-switch photodiode 100 or the dual-switch photodiode 200 is that the larger the optical window size d, the longer the photo-electron transit time required for an electron drifts or diffuses from one switch to the other switch. The operation speed of the photodiode may therefore be affected. The dual-switch photodiode 300 may further improve the operation speed by arranging the p-doped regions and the n-doped regions of the switches in a vertical arrangement. Using this vertical arrangement, the photo-electron transit distance is limited mostly by the thickness t (e.g., ~1 µm) of the absorption layer instead of the window size d (e.g., ~10 µm) of the absorption layer. The dual-switch photodiode 300 includes an absorption layer 306 fabricated on a substrate 302. The substrate 302 may be any suitable substrate where semiconductor devices can be fabricated on. For example, the substrate 302 may be a silicon substrate.

In general, the absorption layer 306 receives an optical signal 312 and converts the optical signal 312 into electrical signals. The absorption layer 306 is similar to the absorption layer 206. In some implementations, the absorption layer 306 may include a p-doped region 309. The p-doped region 309 is similar to the p-doped region 209.

First switches 308a and 308b, and second switches 310a and 310b have been fabricated in the substrate 302. Notably, although FIG. 3A only shows two first switches 308a and 308b and two second switches 310a and 310b, the number of first switches and second switches may be more or less. The first switches 308a and 308b are coupled to a first control signal 322 and a first readout circuit 324. The second switches 310a and 310b are coupled to a second control signal 332 and a second readout circuit 334.

In general, the first control signal 322 and the second control signal 332 control whether the electrons or the holes generated by the absorbed photons are collected by the first readout circuit 324 or the second readout circuit 334. The first control signal 322 is similar to the first control signal 122. The second control signal 332 is similar to the second control signal 132. The first readout circuit 324 is similar to the first readout circuit 124. The second readout circuit 334 is similar to the second readout circuit 134. In some implementations, the first switches 308a and 308b, and the second switches 310a and 310b may be fabricated to collect electrons generated by the absorption layer 306. In this case, the first switches 308a and 308b include p-doped regions 328a and 328b, and n-doped regions 326a and 326b, respectively. For example, the p-doped regions 328a and 328b may have a p+ doping, where the activated dopant concentration may be as high as a fabrication process may achieve, e.g., the peak concentration may be about $2 \times 10^{20}$ cm$^{-3}$ when the substrate 302 is silicon and doped with boron. In some implementation, the doping concentration of the p-doped regions 328a and 328b may be lower than $2 \times 10^{20}$ cm$^{-3}$ to ease the fabrication complexity at the expense of an increased contact resistance. The n-doped regions 326a and 326b may have an n+ doping, where the activated dopant concentration may be as high as a fabrication process may achieve, e.g., the peak concentration may be about $5 \times 10^{20}$ cm$^{-3}$ when the substrate 302 is silicon and doped with phosphorous. In some implementation, the doping concentration of the n-doped regions 326a and 326b may be lower than $5 \times 10^{20}$ cm$^{-3}$ to ease the fabrication complexity at the expense of an increased contact resistance. The distance between the p-doped region 328a and the n-doped region 326a may be designed based on fabrication process design rules. For example, the distance between the p-doped region 328a and the n-doped region 326a may be controlled by the energies associated with the dopant implants. In general, the closer the distance between the p-doped regions 328a/328b and the n-doped regions 326a/326b, the higher the switching efficiency of the generated photo-carriers. The second switches 310a and 310b includes p-doped regions 338a and 338b, and n-doped regions 336a and 336b, respectively. The p-doped regions 338a/338b are similar to the p-doped regions 328a/328b, and the n-doped regions 336a/336b are similar to the n-doped region 326a/326b.

In some implementations, the p-doped regions 328a and 328b are coupled to the first control signal 322. The n-doped regions 326a and 326b are coupled to the readout circuit 324. The p-doped regions 338a and 338b are coupled to the second control signal 332. The n-doped regions 336a and 336b are coupled to the readout circuit 334. The first control signal 322 and the second control signal 332 are used to control the collection of electrons generated by the absorbed photons. For example, when the absorption layer 306 absorbs photons in the optical signal 312, electron-hole pairs are generated and drift or diffuse into the substrate 302. When voltages are used, if the first control signal 322 is biased against the second control signal 332, electric fields are created between the p-doped region 309 and the p-doped regions 328a/328b or the p-doped regions 338a/338b, and free electrons from the absorption layer 306 drift towards the p-doped regions 328a/328b or the p-doped regions 338a/338b depending on the directions of the electric fields. In some implementations, the first control signal 322 may be fixed at a voltage value V1, and the second control signal 332 may alternate between voltage values $V_i \pm \Delta V$. The direction of the bias value determines the drift direction of the electrons. Accordingly, when one group of switches (e.g., first switches 308a and 308b) are switched "on" (i.e., the electrons drift towards the p-doped regions 328a and 328b), the other group of switches (e.g., the second switches 310a and 310b) are switched "off" (i.e., the electrons are blocked from the p-doped regions 338a and 338b). In some implementations, the first control signal 322 and the second control signal 332 may be voltages that are differential to each other.

In each of the first switches 308a/308b, an electric field is created between the p-doped region 328a/328b and the n-doped region 326a/326b. Similarly, in each of the second switches 310a/310b, an electric field is created between the p-doped region 338a/338b and the n-doped region 336a/336b. When the first switches 308a and 308b are switched "on" and the second switches 310a and 310b are switched "off", the electrons are attracted by the p-doped regions 328a and 328b, and the electric field between the p-doped region 328a and the n-doped region 326a further carries the electrons to the n-doped region 326a. Similarly, the electric field between the p-doped region 328b and the n-doped region 326b further carries the electrons to the n-doped region 326b. The readout circuit 324 may then be enabled to process the charges collected by the n-doped regions 326a and 326b. On the other hand, when the second switches 310a and 310b are switched "on" and the first switches 308a and 308b are switched "off", the electrons are attracted by the p-doped regions 338a and 338b, and the electric field between the p-doped region 338a and the n-doped region 336a further carries the electrons to the n-doped region 336a. Similarly, the electric field between the p-doped region 338b and the n-doped region 336b further carries the electrons to the n-doped region 336b. The readout circuit 334 may then be enabled to process the amount of charges collected by the n-doped regions 336a and 336b.

In some implementations, a voltage may be applied between the p-doped and the n-doped regions of a switch to operate the switch in an avalanche regime to increase the sensitivity of the dual-switch photodiode 300. For example, when the distance between the p-doped region 328a and the n-doped region 326a is about 100 nm, it is possible to apply a voltage that is less than 7 V to create an avalanche gain between the p-doped region 328a and the n-doped region 326a.

In some implementations, the p-doped region 309 may be coupled to an external control 314. For example, the p-doped region 309 may be coupled to ground. In some implementations, the p-doped region 309 may be floated and not coupled to any external control. In some implementations, the substrate 302 may be coupled to an external control 316. For example, the substrate 302 may be coupled to ground. In some other implementations, the substrate 302 may be floated and not coupled to any external control.

Figure 3B:
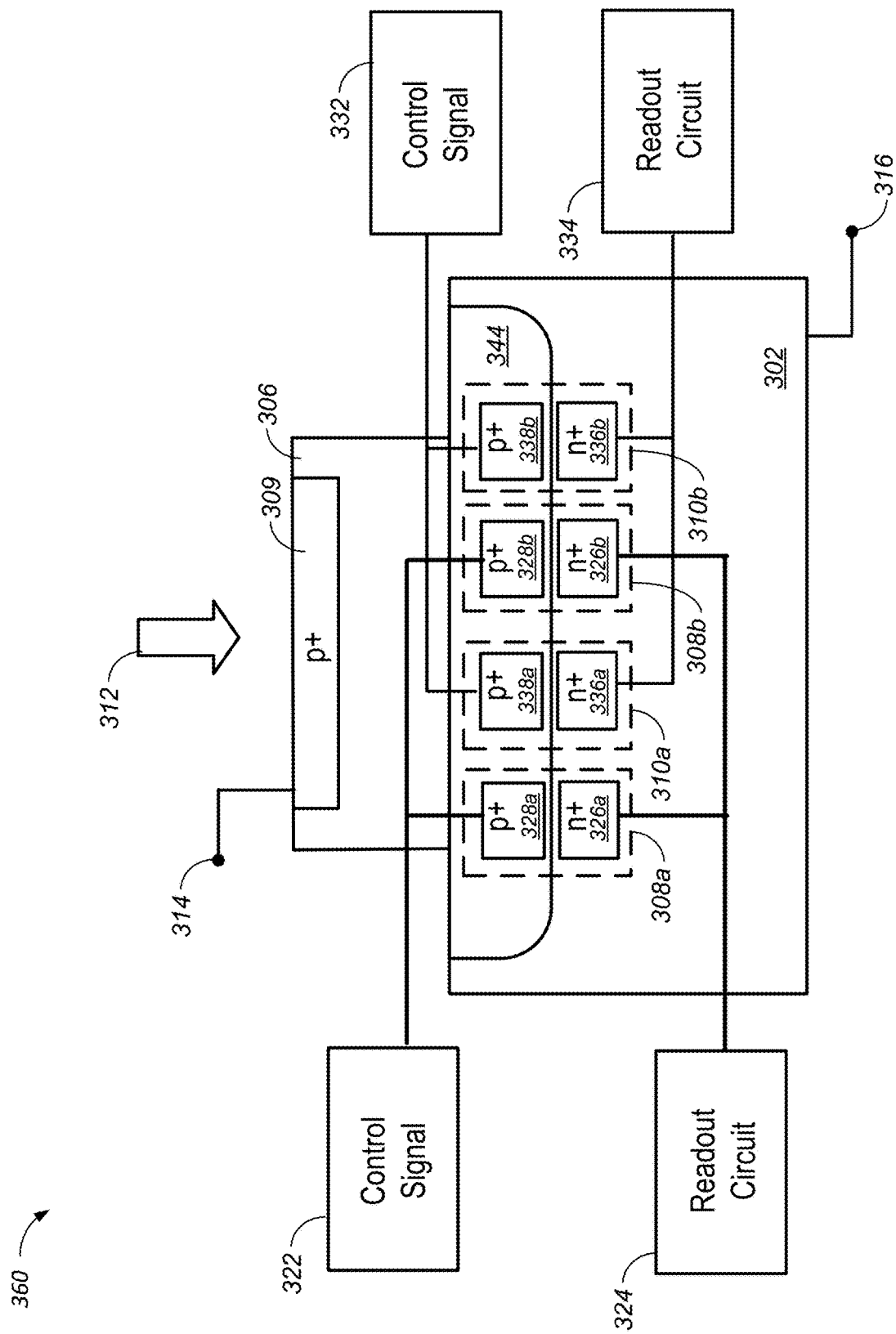

FIG. 3B is an example dual-switch photodiode 360 for converting an optical signal to an electrical signal. The dual-switch photodiode 360 is similar to the dual-switch photodiode 300 in FIG. 3A, but that the dual-switch photodiode 360 further includes an n-well region 344. In addition, the absorption layer 360 may be a p-doped region and the substrate 302 may be a p-doped substrate. In some implementations, the doping level of the n-well region 344 may range from $10^{15}$ cm$^{-3}$ to $10^{17}$ cm$^{-3}$. The doping level of the absorption layer 360 and the substrate 302 may range from $10^{14}$ cm$^{-3}$ to $10^{16}$ cm$^{-3}$.

The arrangement of the p-doped region 328a, the n-well region 344, and the p-doped region 338a forms a PNP junction structure. Similarly, the arrangement of the p-doped region 328b, the n-well region 344, and the p-doped region 338b forms another PNP junction structure. In general, the PNP junction structure reduces a conduction current from the first control signal 322 to the second control signal 332, or alternatively from the second control signal 332 to the first control signal 322. The arrangement of the n-doped region 326a, the p-doped substrate 302, and the n-doped region 336a forms an NPN junction structure. Similarly, the arrangement of the n-doped region 326b, the p-doped substrate 302, and the n-doped region 336b forms an NPN junction structure. In general, the NPN junction structure reduces a charge coupling from the first readout circuit 324 to the second readout circuit 334, or alternatively from the second readout circuit 334 to the first readout circuit 324. In some implementations, the n-well region 344 also effectively reduces the potential energy barrier perceived by the electrons flowing from the absorption layer 306 to the substrate 302.

In some implementations, the p-doped regions 328a, 338a, 328b, and 338b are formed entirely within the n-well region 344. In some other implementations, the p-doped regions 328a, 338a, 328b, and 338b are partially formed in the n-well region 344. For example, a portion of the p-doped region 328a may be formed by implanting the p-dopants in the n-well region 344, while another portion of the p-doped region 328A may be formed by implanting the p-dopants in the substrate 302.

Figure 3C:
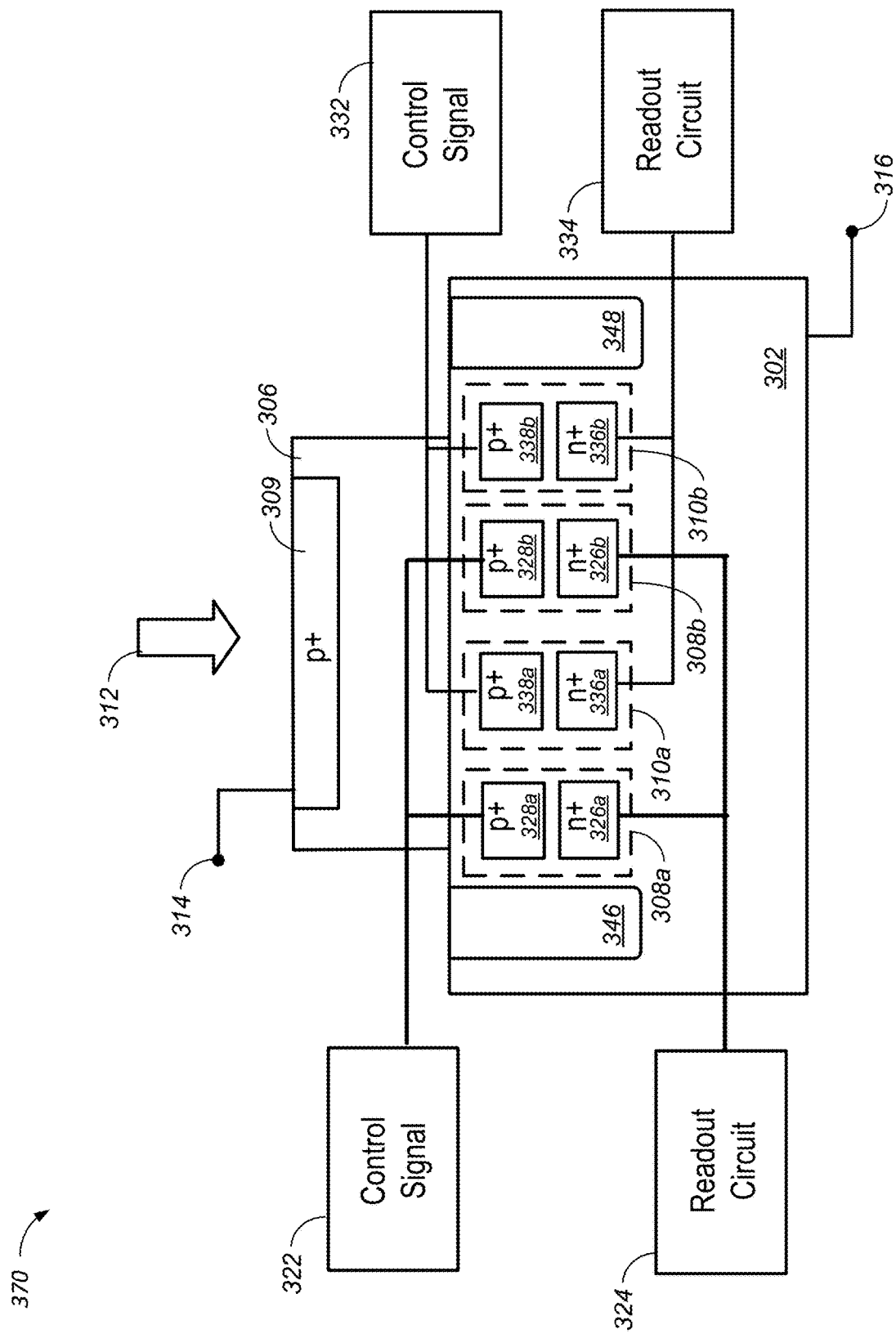

FIG. 3C is an example dual-switch photodiode 370 for converting an optical signal to an electrical signal. The dual-switch photodiode 370 is similar to the dual-switch photodiode 300 in FIG. 3A, but that the dual-switch photodiode 370 further includes one or more p-well regions 346 and one or more p-well regions 348. In some implementations, the one or more p well regions 346 and the one or more p-well regions 348 may be part of a ring structure that surrounds the first switches 308a and 308b, and the second switches 310a and 310b. In some implementations, the doping level of the one or more p-well regions may range from $10^{15}$ cm$^{-3}$ to $10^{20}$ cm$^{-3}$. The one or more p-well regions 346 and 348 may be used as an isolation of photoelectrons from the neighboring pixels.

Figure 3D:
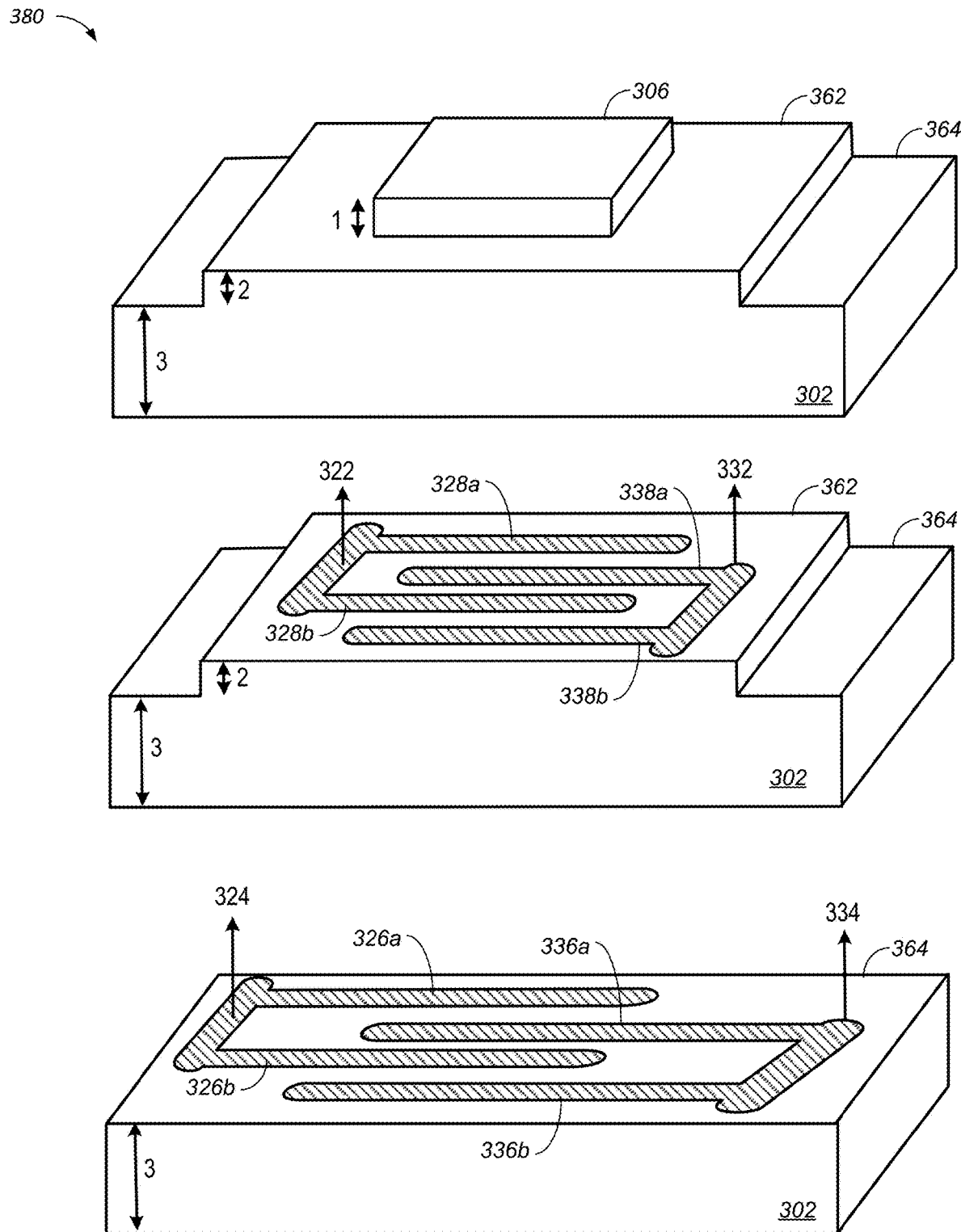

FIG. 3D shows cross-sectional views of the example dual-switch photodiode 380. FIG. 3D shows that the p-doped regions 328a and 328b of the first switches 308a and 308b, and the p-doped regions 338a and 338b of the second switches 310a and 310b may be arranged on a first plane 362 of the substrate 302 in an interdigitated arrangement. FIG. 3D further shows that the n-doped regions 326a and 326b of the first switches 308a and 308b, and the n-doped regions 336a and 336b of the second switches 310a and 310b may be arranged on a second plane 364 of the substrate 302 in an interdigitated arrangement.

Although not shown in FIG. 3A-3D, in some implementations, an optical signal may reach to the dual-switch photodiode from the backside of the substrate 302. One or more optical components may be fabricated on the backside of the substrate 302 to focus, collimate, defocus, filter, or otherwise manipulate the optical signal.

Although not shown in FIG. 3A-3D, in some other implementations, the first switches 308a and 308b, and the second switches 310a and 310b may alternatively be fabricated to collect holes instead of electrons. In this case, the p-doped regions 328a and 328b, the p-doped regions 338a and 338b, and the p-doped region 309 would be replaced by n-doped regions, and the n-doped regions 326a and 326b, and the n-doped regions 336a and 336b would be replaced by p-doped regions. The n-well region 344 would be replaced by a p-well region. The p-well regions 346 and 348 would be replaced by n-well regions.

Although not shown in FIG. 3A-3D, in some implementations, the absorption layer 306 may be bonded to a substrate after the fabrication of the dual-switch photodiode 300, 360, 370, and 380. The substrate may be any material that allows the transmission of the optical signal 312 to reach to the dual-switch photodiode. For example, the substrate may be polymer or glass. In some implementations, one or more optical components may be fabricated on the carrier substrate to focus, collimate, defocus, filter, or otherwise manipulate the optical signal 312.

Although not shown in FIGS. 3A-3D, in some implementations, the dual-switch photodiode 300, 360, 370, and 380 may be bonded (ex: metal to metal bonding, oxide to oxide bonding, hybrid bonding) to a second substrate with circuits including control signals, and/or, readout circuits, and/or phase lock loop (PLL), and/or analog to digital converter (ADC). A metal layer may be deposited on top of the dual-switch photodiode that may be used as a reflector to reflect the optical signal incident from the backside. An oxide layer may be included between the metal layer and the absorptive layer to increase the reflectivity. The metal layer may also be used as the bonding layer for the wafer-bonding process. In some implementations, one or more switches similar to 308a (or 308b) and 310a (or 310b) can be added for interfacing control signals/readout circuits.

Although not shown in FIG. 3A-3D, in some implementations, the absorption layer 306 may be partially or fully embedded/recessed in the substrate 302 to relieve the surface topography and so ease the fabrication process. An example of the embedment technique is described in U.S. patent application Ser. No. 15/228,282 titled "Germanium-Silicon Light Sensing Apparatus," which is fully incorporated by reference herein.

Figure 4A:
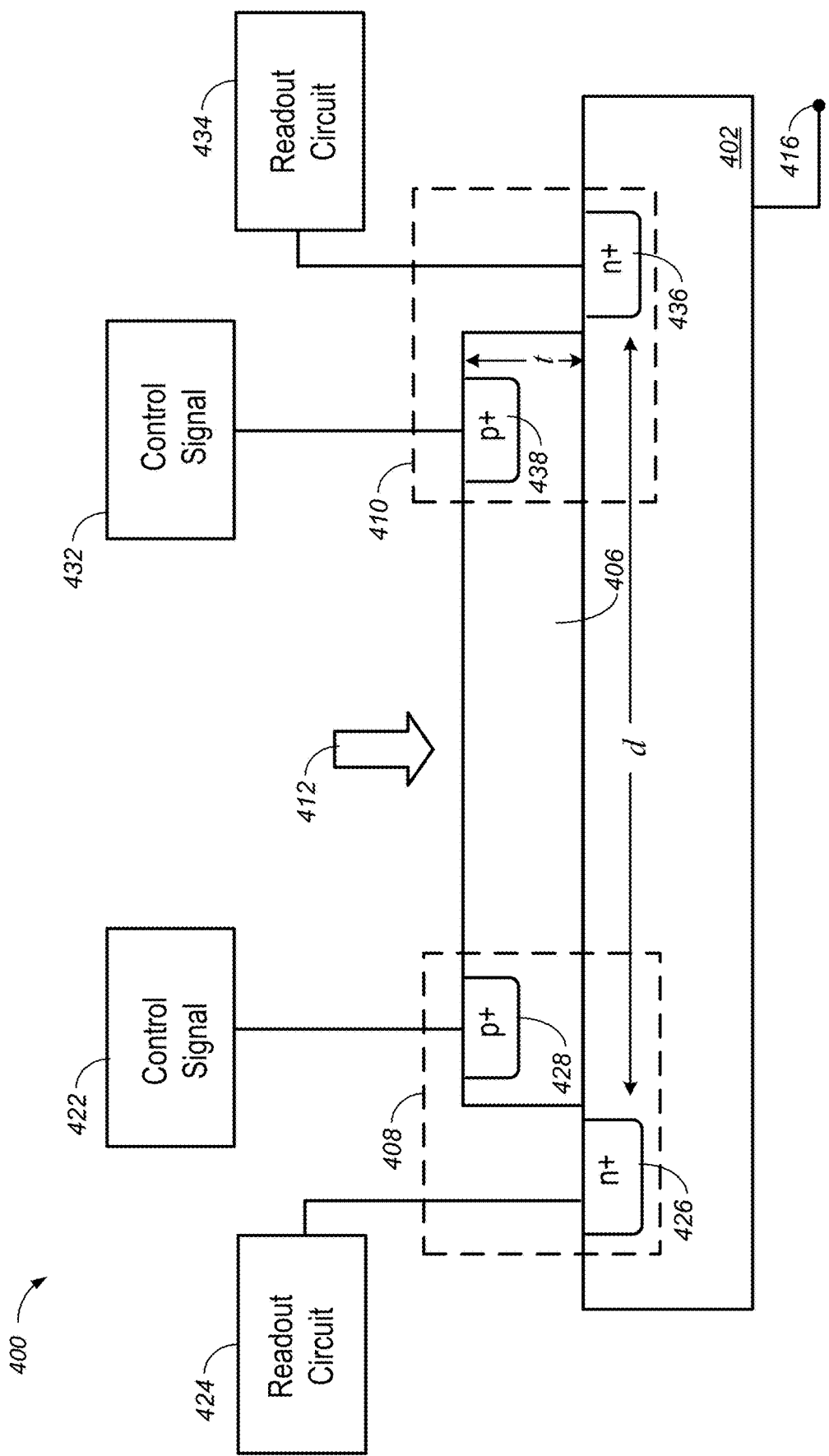
FIGS. 4A, 4B, 4C, 4D, and 4E are examples of a dual-switch photodiode.

FIG. 4A is an example dual-switch photodiode 400 for converting an optical signal to an electrical signal. The dual-switch photodiode 400 includes an absorption layer 406 fabricated on a substrate 402. The substrate 402 may be any suitable substrate where semiconductor devices can be fabricated on. For example, the substrate 402 may be a silicon substrate. The absorption layer 406 includes a first switch 408 and a second switch 410.

In general, the absorption layer 406 receives an optical signal 412 and converts the optical signal 412 into electrical signals. The absorption layer 406 is selected to have a high absorption coefficient at the desired wavelength range. For NIR wavelengths, the absorption layer 406 may be a GeSi mesa, where the GeSi absorbs photons in the optical signal 412 and generates electron-hole pairs. The material composition of germanium and silicon in the GeSi mesa may be selected for specific processes or applications. In some implementations, the absorption layer 406 is designed to have a thickness t. For example, for 850 nm wavelength, the thickness of the GeSi mesa may be approximately 1 μm to have a substantial quantum efficiency. In some implementations, the surface of the absorption layer 406 is designed to have a specific shape. For example, the GeSi mesa may be circular, square, or rectangular depending on the spatial profile of the optical signal 412 on the surface of the GeSi mesa. In some implementations, the absorption layer 406 is designed to have a lateral dimension d for receiving the optical signal 412. For example, the GeSi mesa may have a circular shape, where d can range from 1 μm to 50 μm.

A first switch 408 and a second switch 410 have been fabricated in the absorption layer 406 and the substrate 402. The first switch 408 is coupled to a first control signal 422 and a first readout circuit 424. The second switch 410 is coupled to a second control signal 432 and a second readout circuit 434. In general, the first control signal 422 and the second control signal 432 control whether the electrons or the holes generated by the absorbed photons are collected by the first readout circuit 424 or the second readout circuit 434.

In some implementations, the first switch 408 and the second switch 410 may be fabricated to collect electrons. In this case, the first switch 408 includes a p-doped region 428 implanted in the absorption layer 406 and an n-doped region 426 implanted in the substrate 402. For example, the p-doped region 428 may have a p+ doping, where the activated dopant concentration may be as high as a fabrication process may achieve, e.g., the peak concentration may be about $5 \times 10^{20}$ cm$^{-3}$ when the absorption layer 106 is germanium and doped with boron. In some implementation, the doping concentration of the p-doped region 428 may be lower than $5 \times 10^{20}$ cm$^{-3}$ to ease the fabrication complexity at the expense of an increased contact resistance. The n-doped region 426 may have an n+ doping, where the activated dopant concentration may be as high as a fabrication process may achieve, e.g., e.g., the peak concentration may be about $5 \times 10^{20}$ cm$^{-3}$ when the substrate 402 is silicon and doped with phosphorous. In some implementation, the doping concentration of the n-doped region 426 may be lower than $5 \times 10^{20}$ cm$^{-3}$ to ease the fabrication complexity at the expense of an increased contact resistance. The distance between the p-doped region 428 and the n-doped region 426 may be designed based on fabrication process design rules. In general, the closer the distance between the p-doped region 428 and the n-doped region 426, the higher the switching efficiency of the generated photo-carriers. The second switch 410 includes a p-doped region 438 and an n-doped region 436. The p-doped region 438 is similar to the p-doped region 428, and the n-doped region 436 is similar to the n-doped region 426.

In some implementations, the p-doped region 428 is coupled to the first control signal 422. For example, the p-doped region 428 may be coupled to a voltage source, where the first control signal 422 may be an AC voltage signal from the voltage source. In some implementations, the n-doped region 426 is coupled to the readout circuit 424. The readout circuit 424 may be in a three-transistor configuration consisting of a reset gate, a source-follower, and a selection gate, or any suitable circuitry for processing charges. In some implementations, the readout circuit 424 may be fabricated on the substrate 402. In some other implementations, the readout circuit 424 may be fabricated on another substrate and integrated/co-packaged with the dual-switch photodiode 400 via die/wafer bonding or stacking.

The p-doped region 438 is coupled to the second control signal 432. For example, the p-doped region 438 may be coupled to a voltage source, where the second control signal 432 may be an AC voltage signal having an opposite phase from the first control signal 422. In some implementations, the n-doped region 436 is coupled to the readout circuit 434. The readout circuit 434 may be similar to the readout circuit 424.

The first control signal 422 and the second control signal 432 are used to control the collection of electrons generated by the absorbed photons. For example, when voltages are used, if the first control signal 422 is biased against the second control signal 432, an electric field is created between the p-doped region 428 and the p-doped region 438, and free electrons drift towards the p-doped region 428 or the p-doped region 438 depending on the direction of the electric field. In some implementations, the first control signal 422 may be fixed at a voltage value $V_i$, and the second control signal 432 may alternate between voltage values $V_i \pm \Delta V$. The direction of the bias value determines the drift direction of the electrons. Accordingly, when one switch (e.g., the first switch 408) is switched "on" (i.e., the electrons drift towards the p-doped region 428), the other switch (e.g., the second switch 410) is switched "off" (i.e. the electrons are blocked from the p-doped region 438). In some implementations, the first control signal 422 and the second control signal 432 may be voltages that are differential to each other.

In general, a difference between the Fermi level of a p-doped region and the Fermi level of an n-doped region creates an electric field between the two regions. In the first switch 408, an electric field is created between the p-doped region 428 and the n-doped region 426. Similarly, in the second switch 410, an electric field is created between the p-doped region 438 and the n-doped region 436. When the first switch 408 is switched "on" and the second switch 410 is switched "off", the electrons are attracted by the p-doped region 428, and the electric field between the p-doped region 428 and the n-doped region 426 further carries the electrons to the n-doped region 426. The readout circuit 424 may then be enabled to process the charges collected by the n-doped region 426. On the other hand, when the second switch 410 is switched "on" and the first switch 408 is switched "off", the electrons are attracted by the p-doped region 438, and the electric field between the p-doped region 438 and the n-doped region 436 further carries the electrons to the n-doped region 436. The readout circuit 434 may then be enabled to process the charges collected by the n-doped region 436.

In some implementations, the substrate 402 may be coupled to an external control 416. For example, the substrate 402 may be coupled to ground. In some other implementations, the substrate 402 may be floated and not coupled to any external control.

Figure 4B:
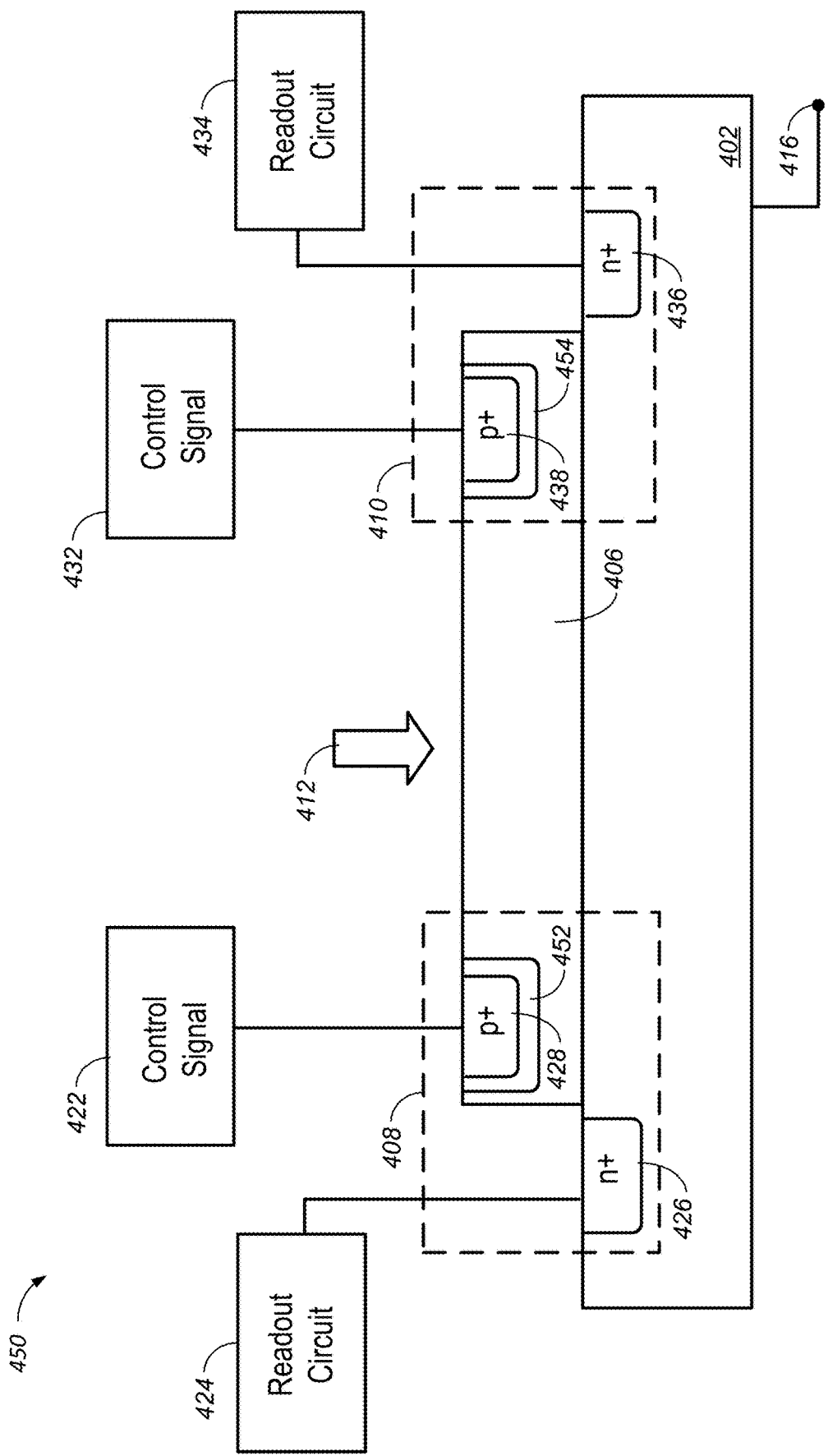

FIG. 4B is an example dual-switch photodiode 450 for converting an optical signal to an electrical signal. The dual-switch photodiode 450 is similar to the dual-switch photodiode 400 in FIG. 4A, but that the first switch 408 and the second switch 410 further includes an n-well region 452 and an n-well region 454, respectively. In addition, the absorption layer 406 may be a p-doped layer and the substrate 402 may be a p-doped substrate. In some implementations, the doping level of the n-well regions 452 and 454 may range from $10^{15}$ cm$^{-3}$ to $10^{17}$ cm$^{-3}$. The doping level of the absorption layer 406 and the substrate 402 may range from $10^{14}$ cm$^{-3}$ to $10^{16}$ cm$^{-3}$.

The arrangement of the p-doped region 428, the n-well region 452, the absorption layer 406, the n-well region 454, and the p-doped region 438 forms a PNPNP junction structure. In general, the PNPNP junction structure reduces a conduction current from the first control signal 422 to the second control signal 432, or alternatively from the second control signal 432 to the first control signal 422.

The arrangement of the n-doped region 426, the p-doped substrate 402, and the n-doped region 436 forms an NPN junction structure. In general, the NPN junction structure reduces a charge coupling from the first readout circuit 424 to the second readout circuit 434, or alternatively from the second readout circuit 434 to the first readout circuit 424.

In some implementations, the p-doped region 428 is formed entirely within the n-well region 452. In some other implementations, the p-doped region 428 is partially formed in the n-well region 452. For example, a portion of the p-doped region 428 may be formed by implanting the p-dopants in the n-well region 452, while another portion of the p-doped region 428 may be formed by implanting the p-dopants in the absorption layer 406. Similarly, in some implementations, the p-doped region 438 is formed entirely within the n-well region 454. In some other implementations, the p-doped region 438 is partially formed in the n-well region 454.

Figure 4C:
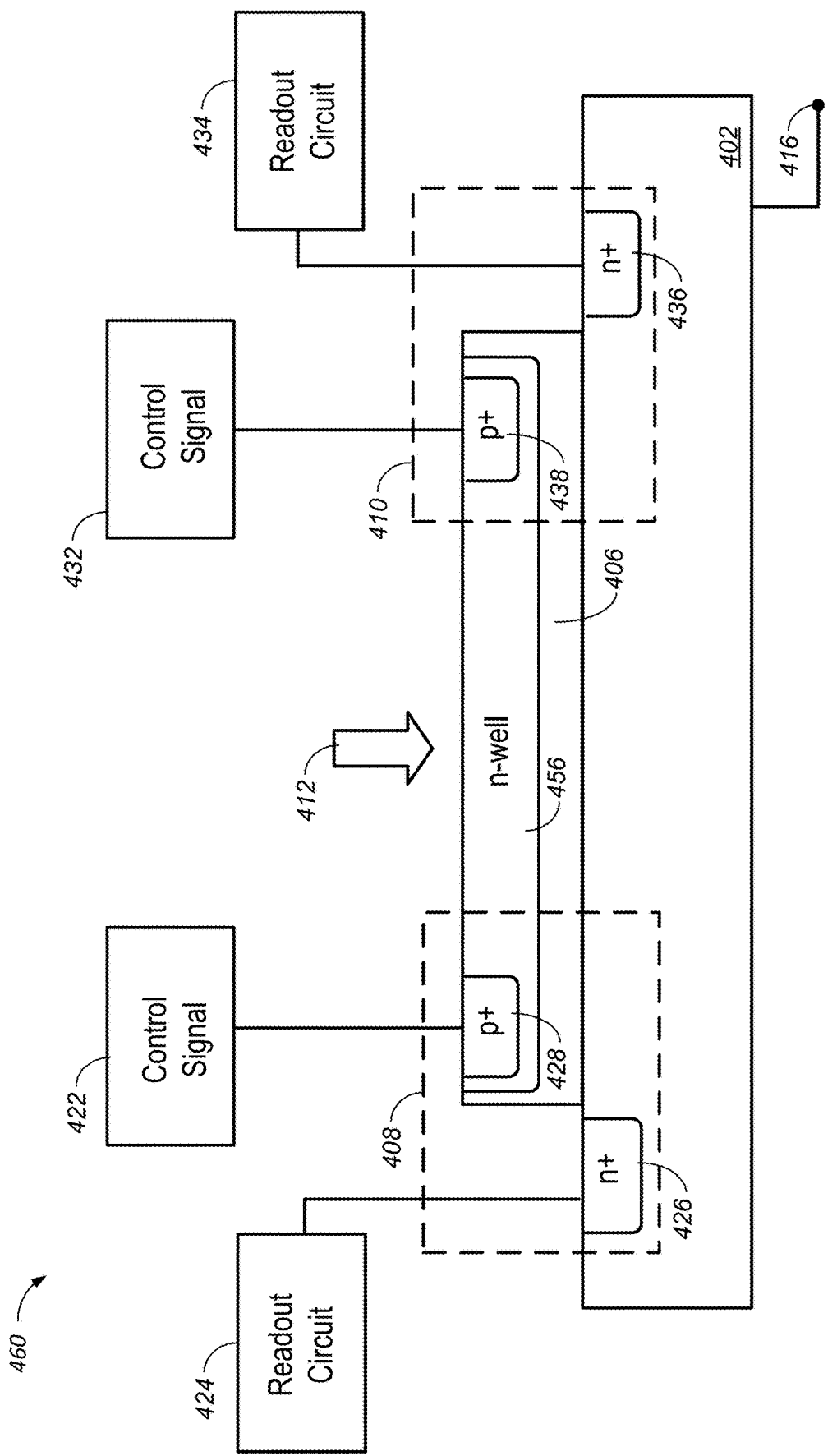

FIG. 4C is an example dual-switch photodiode 460 for converting an optical signal to an electrical signal. The dual-switch photodiode 460 is similar to the dual-switch photodiode 400 in FIG. 4A, but that the absorption layer 406 further includes an n-well region 456. In addition, the absorption layer 406 may be a p-doped region and the substrate 402 may be a p-doped substrate. In some implementations, the doping level of the n-well region 456 may range from $10^{15}$ cm$^{-3}$ to $10^{17}$ cm$^{-3}$. The doping level of the absorption layer 406 and the substrate 402 may range from $10^{14}$ cm$^{-3}$ to $10^{16}$ cm$^{-3}$.

The arrangement of the p-doped region 428, the n-well region 456, and the p-doped region 438 forms a PNP junction structure. In general, the PNP junction structure reduces a conduction current from the first control signal 422 to the second control signal 432, or alternatively from the second control signal 432 to the first control signal 422.

The arrangement of the n-doped region 426, the p-doped absorption layer 406, and the n-doped region 436 forms an NPN junction structure. In general, the NPN junction structure reduces a charge coupling from the first readout circuit 424 to the second readout circuit 434, or alternatively from the second readout circuit 434 to the first readout circuit 424.

In some implementations, the p-doped regions 428 and 438 are formed entirely within the n-well region 456. In some other implementations, the p-doped region 428 and 438 are partially formed in the n-well region 456. For example, a portion of the p-doped region 428 may be formed by implanting the p-dopants in the n-well region 456, while another portion of the p-doped region 428 may be formed by implanting the p-dopants in the absorption layer 406.

Figure 4D:
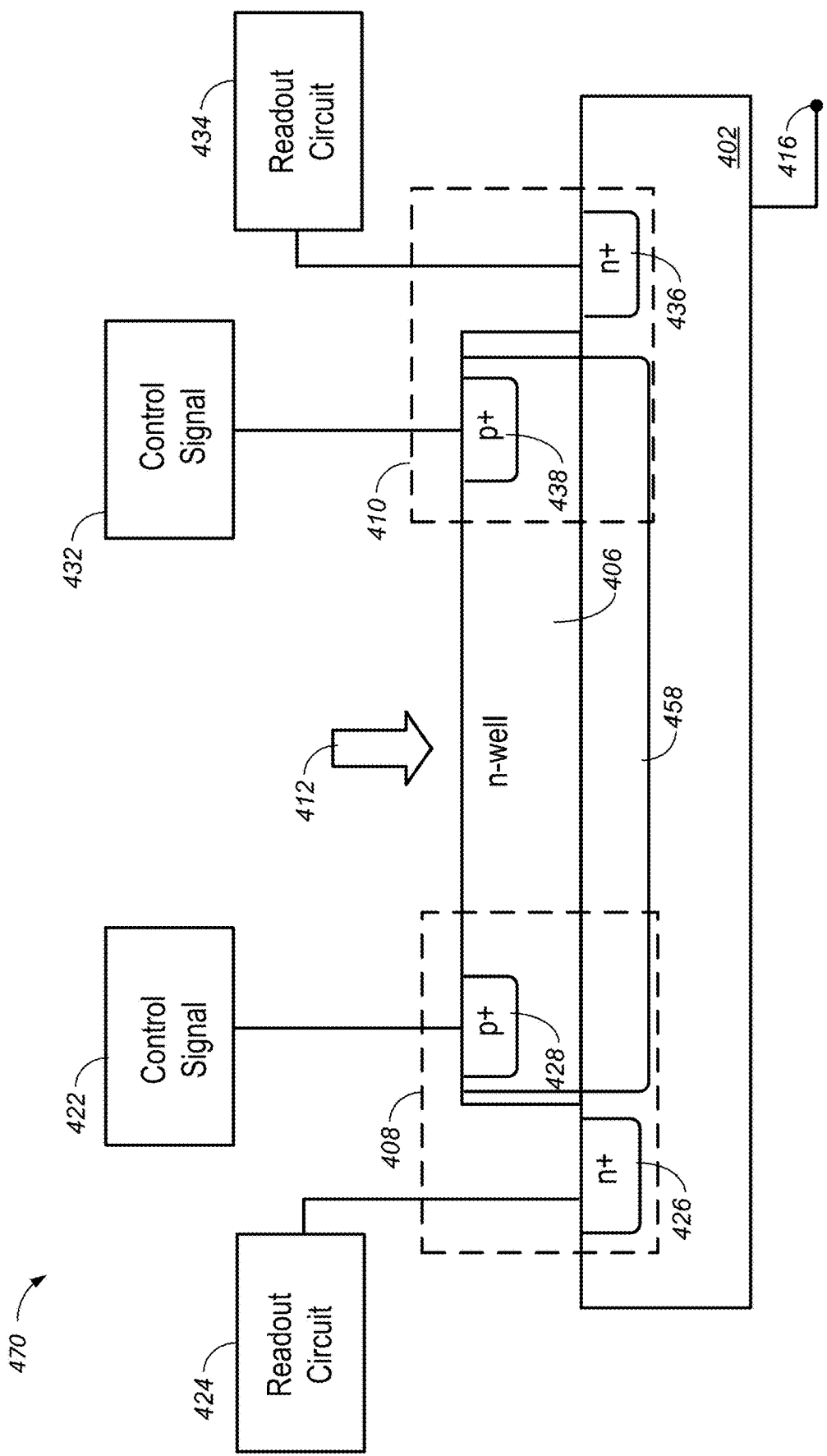

FIG. 4D is an example dual-switch photodiode 470 for converting an optical signal to an electrical signal. The dual-switch photodiode 470 is similar to the dual-switch photodiode 460 in FIG. 4C, but that the n-well region 458 is formed to extend from the absorption layer 406 into the substrate 202. In addition, the absorption layer 406 may be a p-doped region and the substrate 402 may be a p-doped substrate. In some implementations, the doping level of the n-well region 456 may range from $10^{15}$ cm$^{-3}$ to $10^{17}$ cm$^{-3}$. The doping level of the absorption layer 406 and the substrate 402 may range from $10^{14}$ cm$^{-3}$ to $10^{16}$ cm$^{-3}$.

The arrangement of the p-doped region 428, the n-well region 458, and the p-doped region 438 forms a PNP junction structure, which further reduces a conduction current from the first control signal 422 to the second control signal 432, or alternatively from the second control signal 432 to the first control signal 422. The arrangement of the n-doped region 426, the p-doped substrate 402, the n-well region 458, the p-doped substrate 402, and the n-doped region 436 forms an NPNPN junction structure, which further reduces a charge coupling from the first readout circuit 424 to the second readout circuit 434, or alternatively from the second readout circuit 434 to the first readout circuit 424. In some implementations, the n-well region 458 also effectively reduces the potential energy barrier perceived by the electrons flowing from the absorption layer 406 to the substrate 402.

Figure 4E:
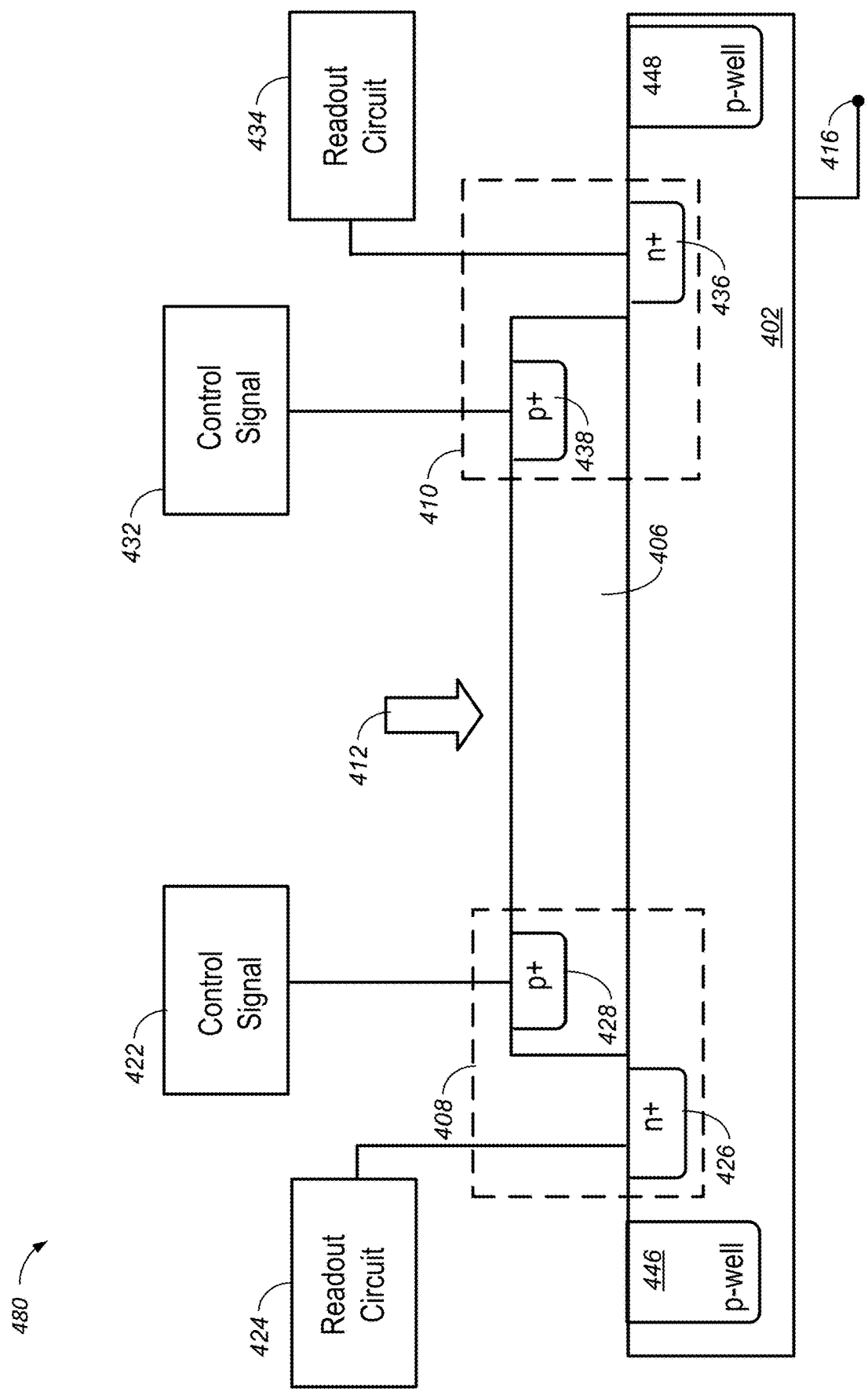

FIG. 4E is an example dual-switch photodiode 480 for converting an optical signal to an electrical signal. The dual-switch photodiode 480 is similar to the dual-switch photodiode 400 in FIG. 4A, but that the dual-switch photodiode 480 further includes one or more p-well regions 446 and one or more p-well regions 448. In some implementations, the one or more p-well regions 446 and the one or more p-well regions 448 may be part of a ring structure that surrounds the first switch 408 and the second switch 410. In some implementations, the doping level of the one or more p-well regions 446 and 448 may range from $10^{15}$ cm$^{-3}$ to $10^{20}$ cm$^{-3}$. The one or more p-well regions 446 and 448 may be used as an isolation of photo-electrons from the neighboring pixels.

Although not shown in FIG. 4A-4E, in some implementations, an optical signal may reach to the dual-switch photodiode from the backside of the substrate 402. One or more optical components may be fabricated on the backside of the substrate 402 to focus, collimate, defocus, filter, or otherwise manipulate the optical signal.

Although not shown in FIG. 4A-4E, in some other implementations, the first switch 408 and the second switch 410 may alternatively be fabricated to collect holes instead of electrons. In this case, the p-doped region 428 and the p-doped region 438 would be replaced by n-doped regions, and the n-doped region 426 and the n-doped region 436 would be replaced by p-doped regions. The n-well regions 452, 454, 456, and 458 would be replaced by p-well regions. The p-well regions 446 and 448 would be replaced by n-well regions.

Although not shown in FIG. 4A-4E, in some implementations, the absorption layer 406 may be bonded to a substrate after the fabrication of the dual-switch photodiode 400, 450, 460, 470, and 480. The substrate may be any material that allows the transmission of the optical signal 412 to reach to the dual-switch photodiode. For example, the substrate may be polymer or glass. In some implementations, one or more optical components may be fabricated on the carrier substrate to focus, collimate, defocus, filter, or otherwise manipulate the optical signal 412.

Although not shown in FIGS. 4A-4E, in some implementations, the dual-switch photodiode 400, 450, 460, 470, and 480 may be bonded (ex: metal to metal bonding, oxide to oxide bonding, hybrid bonding) to a second substrate with circuits including control signals, and/or, readout circuits, and/or phase lock loop (PLL), and/or analog to digital converter (ADC). A metal layer may be deposited on top of the dual-switch photodiode that may be used as a reflector to reflect the optical signal incident from the backside. An oxide layer may be included between the metal layer and the absorptive layer to increase the reflectivity. The metal layer may also be used as the bonding layer for the wafer-bonding process. In some implementations, one or more switches similar to 408 and 410 can be added for interfacing control signals/readout circuits.

Although not shown in FIG. 4A-4E, in some implementations, the absorption layer 406 may be partially or fully embedded/recessed in the substrate 402 to relieve the surface topography and so ease the fabrication process. An example of the embedment technique is described in U.S. patent application Ser. No. 15/228,282 titled "Germanium-Silicon Light Sensing Apparatus," which is fully incorporated by reference herein.

Figure 5A:
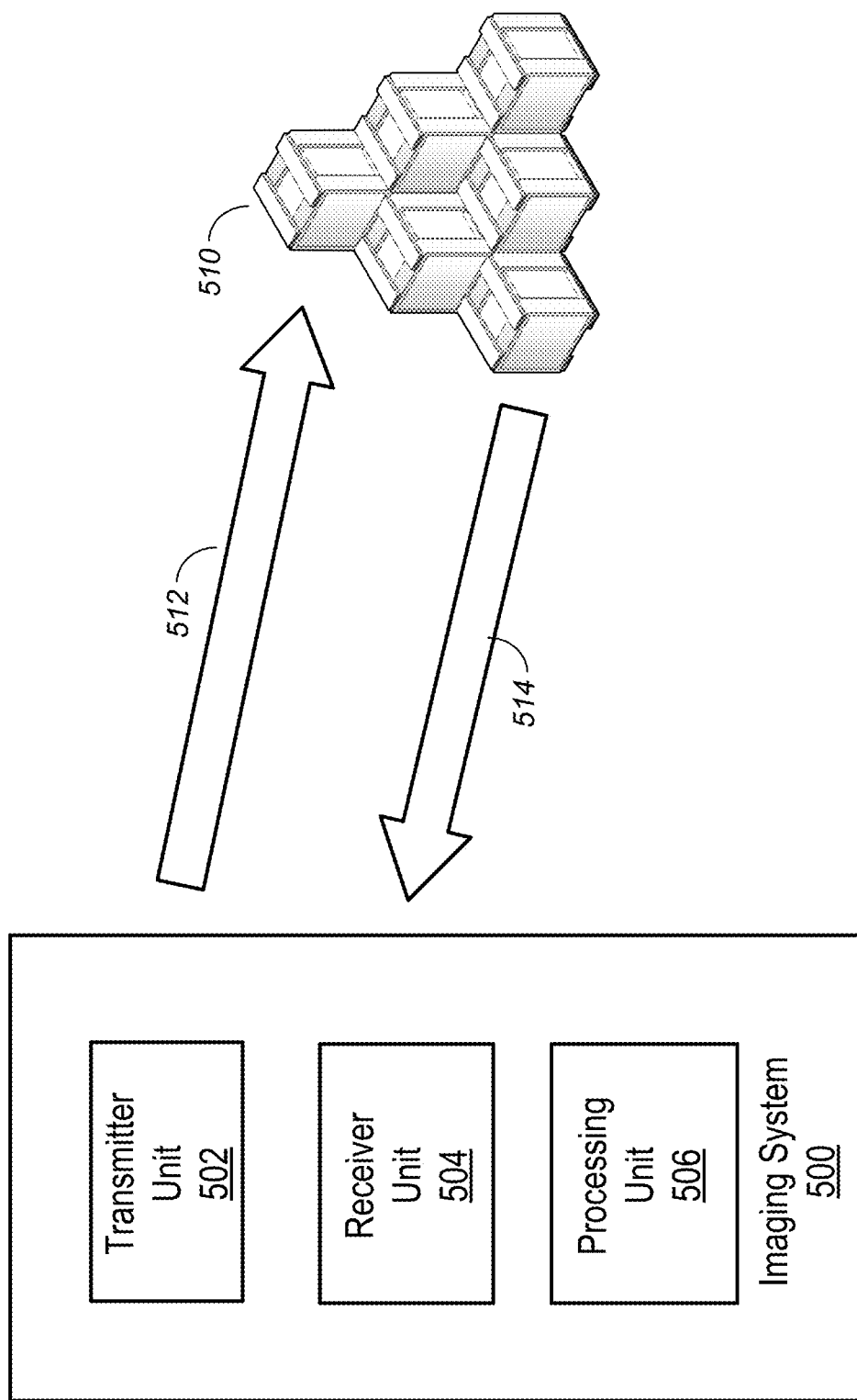
FIG. 5A is a block diagram of an example of an imaging system.

FIG. 5A shows an example imaging system 500 for determining characteristics of a target object 510. The target object 510 may be a three-dimensional object. The imaging system 500 may include a transmitter unit 502, a receiver unit 504, and a processing unit 506. In general, the transmitter unit 502 emits light 512 towards the target object 510. The transmitter unit 502 may include one or more light sources, control circuitry, and/or optical elements. For example, the transmitter unit 502 may include one or more NIR LEDs or lasers, where the emitted light 512 may be collimated by a collimating lens to propagate in free space.

In general, the receiver unit 504 receives the reflected light 514 that is reflected from the target object 510. The receiver unit 504 may include one or more photodiodes, control circuitry, and/or optical elements. For example, the receiver unit 504 may include an image sensor, where the image sensor includes multiple pixels fabricated on a semiconductor substrate. Each pixel may include one or more dual-switch photodiodes for detecting the reflected light 514, where the reflected light 514 may be focused to the dual-switch photodiodes. Each dual-switch photodiode may be a dual-switch photodiode disclosed in this application.

In general, the processing unit 506 processes the photo-carriers generated by the receiver unit 504 and determines characteristics of the target object 510. The processing unit 506 may include control circuitry, one or more processors, and/or computer storage medium that may store instructions for determining the characteristics of the target object 510. For example, the processing unit 506 may include readout circuits and processors that can process information associated with the collected photo-carriers to determine the characteristics of the target object 510. In some implementations, the characteristics of the target object 510 may be depth information of the target object 510. In some implementations, the characteristics of the target object 510 may be material compositions of the target object 510.

Figure 5B:
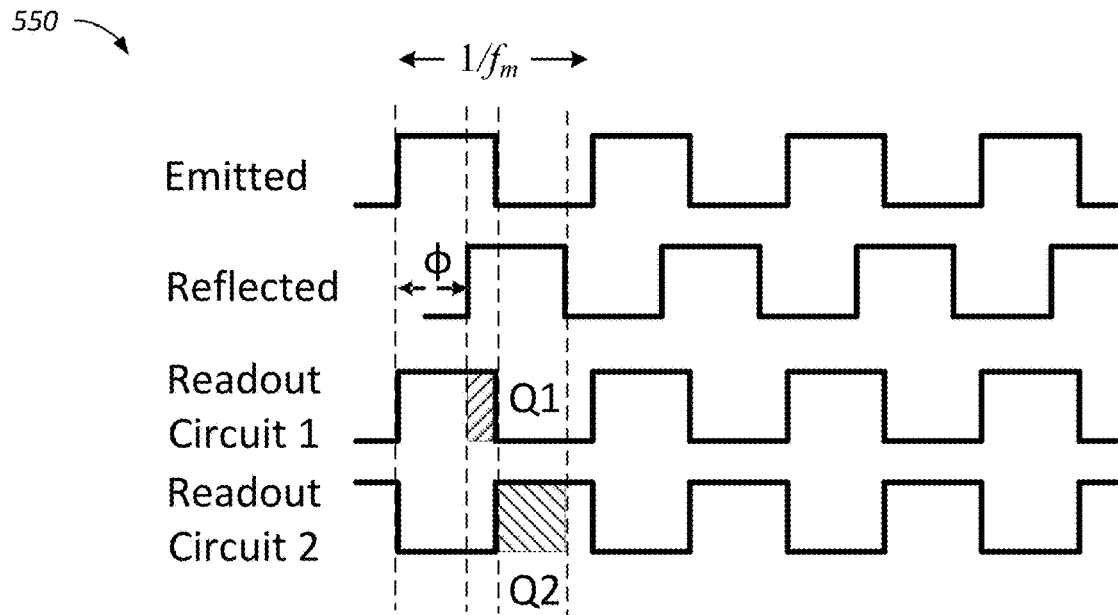
FIGS. 5B and 5C show examples of techniques for determining characteristics of an object using an imaging system.

FIG. 5B shows one example technique for determining characteristics of the target object 510. The transmitter unit 502 may emit light pulses 512 modulated at a frequency $f_m$ with a duty cycle of 50%. The receiver unit 504 may receive reflected light pulses 514 having a phase shift of $\Phi$. The dual-switch photodiodes are controlled such that the readout circuit 1 reads the collected charges $Q_1$ in a phase synchronized with the emitted light pulses, and the readout circuit 2 reads the collected charges $Q_2$ in an opposite phase with the emitted light pulses. In some implementations, the distance, D, between the imaging system 500 and the target object 510 may be derived using the equation $$D = \frac{c}{4f_m} \frac{Q_2}{Q_1 + Q_2}, \quad (1)$$

where c is the speed of light.

Figure 5C:
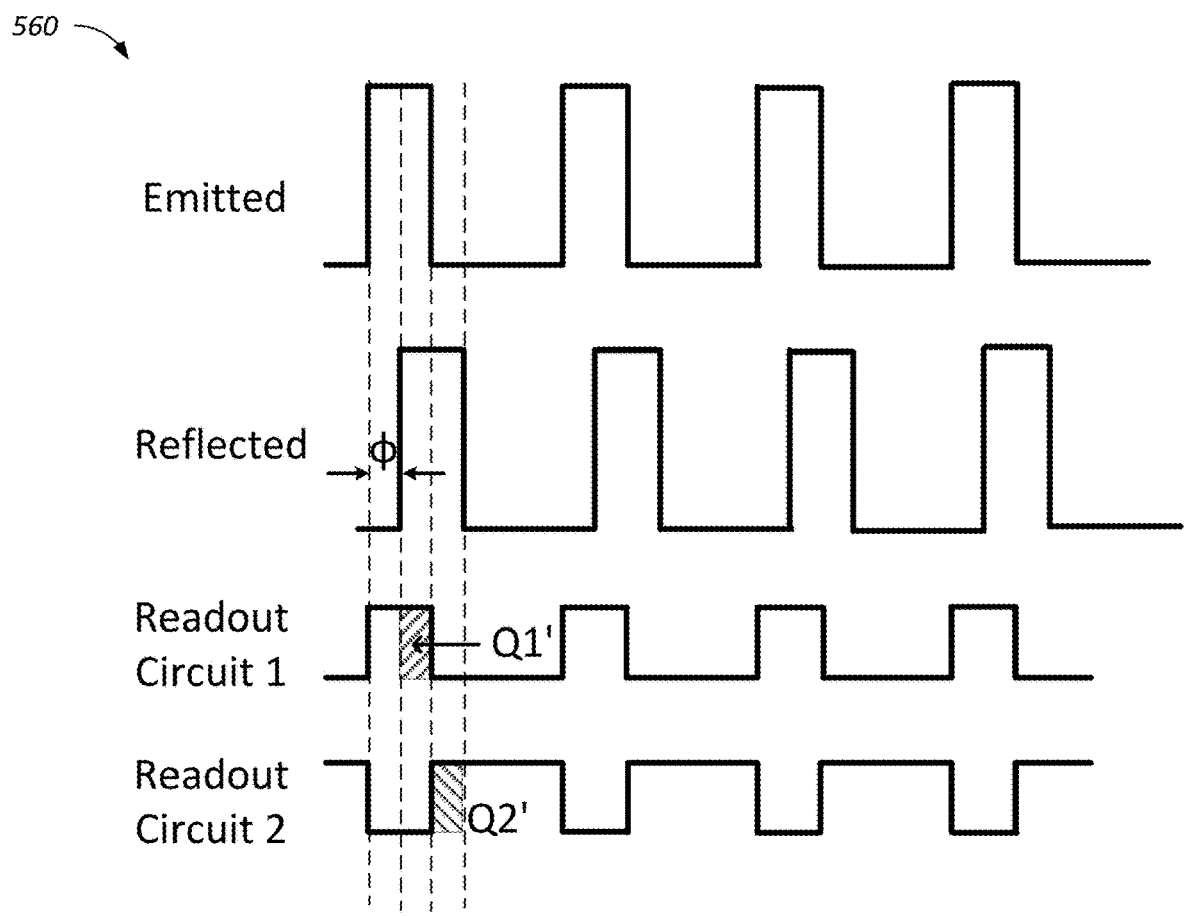

FIG. 5C shows another example technique for determining characteristics of the target object 510. The transmitter unit 502 may emit light pulses 512 modulated at a frequency $f_m$ with a duty cycle of less than 50%. By reducing the duty cycle of the optical pulses by a factor of N, but increasing the intensity of the optical pulses by a factor of N at the same time, the signal-to-noise ratio of the received reflected light pulses 514 may be improved while maintaining substantially the same power consumption for the imaging system 500. This is made possible when the device bandwidth is increased so that the duty cycle of the optical pulses can be decreased without distorting the pulse shape. The receiver unit 504 may receive reflected light pulses 514 having a phase shift of $\Phi$. The multi-gate photodiodes are controlled such that a readout circuit 1 reads the collected charges $Q_1'$ in a phase synchronized with the emitted light pulses, and a readout circuit 2 reads the collected charges $Q_2'$ in a delayed phase with the emitted light pulses. In some implementations, the distance, D, between the imaging system 500 and the target object 510 may be derived using the equation $$D = \frac{c}{4Nf_m} \frac{Q_2'}{Q_1' + Q_2'}. \quad (2)$$

Figure 6:
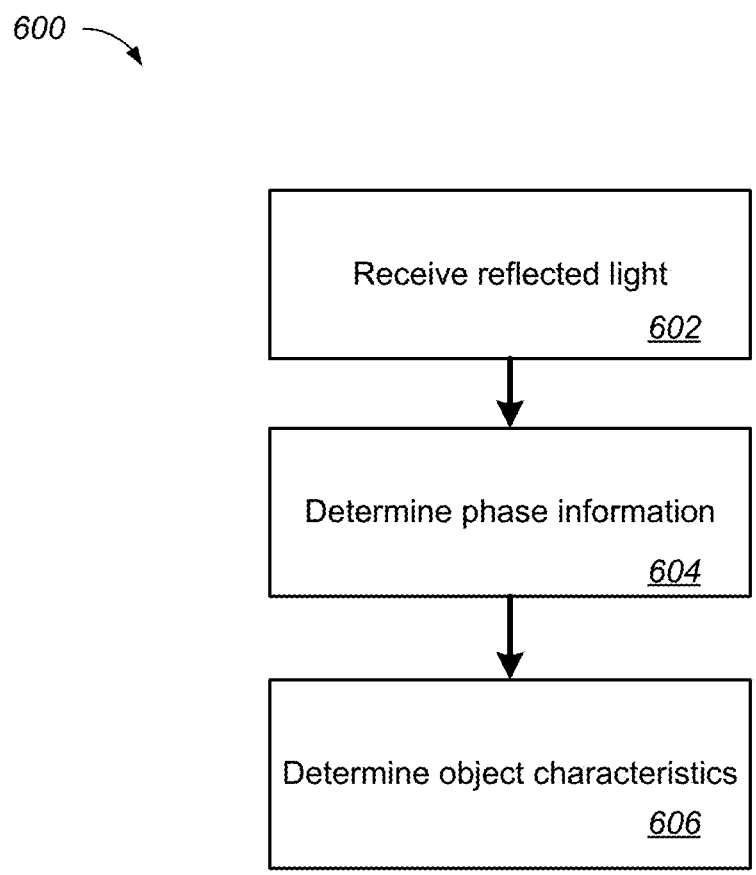
FIG. 6 shows an example of a flow diagram for determining characteristics of an object using an imaging system.

FIG. 6 shows an example of a flow diagram 600 for determining characteristics of an object using an imaging system. The process 600 may be performed by a system such as the imaging system 500.

The system receives reflected light (602). For example, the transmitter unit 502 may emit NIR light pulses 512 towards the target object 510. The receiver unit 504 may receive the reflected NIR light pulses 514 that is reflected from the target object 510.

The system determines phase information (604). For example, the receiver unit 504 may include an image sensor, where the image sensor includes multiple pixels fabricated on a semiconductor substrate. Each pixel may include one or more dual-switch photodiodes for detecting the reflected light pulses 514. The type of dual-switch photodiodes may be a dual-switch photodiode disclosed in this application, where the phase information may be determined using techniques described in reference to FIG. 5B or FIG. 5C.

The system determines object characteristics (606). For example, the processing unit 506 may determine depth information of the object 510 based on the phase information using techniques described in reference to FIG. 5B or FIG. 5C.

In some implementations, an image sensor includes multiple pixels are fabricated on a semiconductor substrate, where each pixel may include one or more dual-switch photodiodes 100, 160, 170, 180, 200, 250, 260, 270, 300, 360, 370, 380, 400, 450, 460, 470, and 480 for detecting the reflected light as illustrated in FIGS. 5A and 5B. The isolation between these pixels may be implemented based on an insulator isolation such as using an oxide or nitride layer, or based on an implant isolation such as using p+ or n+ region to block signal electrons or holes, or based on an intrinsic built-in energy barrier such as a using the germanium-silicon heterojunction interface.

A number of implementations have been described. Nevertheless, it will be understood that various modifications may be made without departing from the spirit and scope of the disclosure. For example, various forms of the flows shown above may be used, with steps re-ordered, added, or removed.

Various implementations may have been discussed using two-dimensional cross-sections for easy description and illustration purpose. Nevertheless, the three-dimensional variations and derivations should also be included within the scope of the disclosure as long as there are corresponding two-dimensional cross-sections in the three-dimensional structures.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments have been described. Other embodiments are within the scope of the following claims. For example, the actions recited in the claims may be performed in a different order and still achieve desirable results.

What is claimed is:

1. An optical apparatus, comprising:
    a semiconductor substrate having a first material composition;
    a light absorption material supported by the semiconductor substrate and having a second material composition different from the first material composition, wherein the light absorption material is configured to:
        absorb incident light within a first wavelength band; and
        generate photo-carriers in response to absorbing the incident light;
    a first switch electrically coupled to the light absorption material and comprising:
        a first terminal configured to receive a first control signal; and
        a second terminal configured to collect at least some of the photo-carriers; and
    a first read-out circuit electrically coupled to the second terminal of the first switch and configured to read out the photo-carriers collected by the second terminal of the first switch.

2. The optical apparatus of claim 1, wherein the first material composition comprises silicon.

3. The optical apparatus of claim 1, wherein the second material composition comprises germanium.

4. The optical apparatus of claim 1, wherein the first wavelength band comprises near-infrared (NIR) light.

5. The optical apparatus of claim 1, further comprising a metal layer arranged over the light absorption material.

6. The optical apparatus of claim 1, wherein the first terminal comprises a first p-doped region and the second terminal comprises a first n-doped region.

7. The optical apparatus of claim 6, wherein the first p-doped region is entirely or partially formed within an n-well region.

8. The optical apparatus of claim 1, wherein the light absorption material is embedded in the semiconductor substrate.

9. A system, comprising:
    a light source for generating photons within a first wavelength band; and
    an image sensor comprising a plurality of pixels supported by a semiconductor substrate having a first material composition, wherein each pixel of the plurality of pixels comprises:
        a light absorption material supported by the semiconductor substrate and having a second material composition different from the first material composition, wherein the light absorption material is configured to:
            absorb an incident light within the first wavelength band; and
            generate photo-carriers in response to absorbing the incident light;
        one or more first switches electrically coupled to a first read-out circuit and controlled by a first control signal, each first switch of the one or more first switches configured to collect at least a first portion of the photo-carriers based on the first control signal; and
        one or more second switches electrically coupled to a second read-out circuit and controlled by a second control signal, each second switch of the one or more second switches configured to collect at least a second portion of the photo-carriers based on the second control signal, wherein the first portion of the photo-carriers and the second portion of the photo-carriers are of a same type of carriers.

10. The system of claim 9, wherein the second material composition comprises a germanium composition.

11. The system of claim 9, further comprising a metal layer arranged over the light absorption material.

12. The system of claim 9, wherein the light absorption material is embedded in the semiconductor substrate.

\* \* \* \* \*